United States Patent

Han et al.

[11] Patent Number: 6,158,017
[45] Date of Patent: Dec. 5, 2000

[54] METHOD FOR STORING PARITY AND REBUILDING DATA CONTENTS OF FAILED DISKS IN AN EXTERNAL STORAGE SUBSYSTEM AND APPARATUS THEREOF

[75] Inventors: Tack-Don Han, Seoul; Shin-Dug Kim, Goyang; Sung-Bong Yang; Kyoung-Woo Lee, both of Seoul; Suk Chang, Seongnam, all of Rep. of Korea

[73] Assignee: Samsung Electronics Co., Ltd., Rep. of Korea

[21] Appl. No.: 09/039,679

[22] Filed: Mar. 16, 1998

[30] Foreign Application Priority Data

Jul. 15, 1997 [KR] Rep. of Korea ............... 97-32758

[51] Int. Cl.⁷ ............... G06F 12/16; H03M 13/00
[52] U.S. Cl. ............... 714/6; 711/114; 714/755
[58] Field of Search ............... 714/5, 6, 7, 8, 714/753, 755, 756, 770; 711/112, 114

[56] References Cited

U.S. PATENT DOCUMENTS

| | | | |
|---|---|---|---|
| 5,271,012 | 12/1993 | Blaum et al. | 714/6 |
| 5,351,246 | 9/1994 | Blaum et al. | 714/6 |
| 5,513,192 | 4/1996 | Janku et al. | 714/804 |
| 5,579,475 | 11/1996 | Blaum et al. | 714/7 |

OTHER PUBLICATIONS

Blaum et al, "Evenodd: An Optimal Scheme for Tolerating Double Disk Failures in RAID Architectures," Computer Architecture, 1994., pp. 245–254, Apr. 1994.
"The RAIDBook: A Source for RAID Technology," The RAID Advisory Board, pp. 1–108, Jun. 1993.
Peter M. Chen et al., "RAID: High–Performance, Reliable Secondary Storage", ACM Computing Surveys, vol. 26, No. 2, Jun. 1994, pp. 145–185.
Mario Blaum et al., "EVENODD: An Efficient Scheme for Tolerating Double Disk Failures in RAID Architectures", IEEE Transactions on Computers, vol. 44, No. 2, Feb. 1995, pp. 192–202.

David A. Patterson et al., A Case for Redundant Arrays of Inexpensive Disks (RAID), Computer Science Division, Dept. of Electrical Engineering & Computer Sciences, University of California, Berkeley, CA.

Chan–Ik Park, "Efficient Placement of Parity and Data to Tolerate Two Disk Failures in Disk Array Systems", IEEE Transactions on Parellel and Distributed Systems, vol. 6, No. 11, Nov. 1995, pp. 1177–1184.

Garth A. Gibson et al., Coding Techniques for Handling Failures in Large Disk Arrays[1], Computer Science Division, Electrical Engineering & Computer Sciences, Univ. of California at Berkeley, pp. 1–29.

*Primary Examiner*—Robert W. Beausoliel, Jr.
*Assistant Examiner*—Christopher A. Revak
*Attorney, Agent, or Firm*—Dilworth & Barrese

[57] ABSTRACT

A method for storing parity and rebuilding the data contents of two failed disks in an external storage subsystem comprises the steps of: proving a disk array defined as a matrix of $(N-1)^*N$ including N disks each logically divided into $N-1$ data blocks where N is a prime number, the data blocks of a row being defined as a horizontal parity group, the data blocks existing in a rightwardly and upwardly continuous diagonal line being defined as a diagonal parity group; defining the data blocks existing in the diagonal line leftwardly and downwardly from the first data block of the $(N-1)$ disk to the last data block of the first disk as horizontal parity blocks; defining the data blocks existing in the $(N-1)$ row of the matrix as diagonal parity blocks; exclusive OR'ing (XORing) the contents of each of the horizontal and diagonal parity groups to obtain the parity value stored into the parity block of the corresponding horizontal or diagonal parity group; and analyzing a diagonal parity group including an error data block of the two failed disks to restore the error data block and then, the horizontal parity group including the restored error data block to restore another error data block, wherein the last analyzing step is repeated to completely rebuild the data contents of the two failed disks.

24 Claims, 26 Drawing Sheets

METHOD FOR STORING PARITY AND REBUILDING DATA CONTENTS OF FAILED DISKS IN AN EXTERNAL STORAGE SUBSYSTEM AND APPARATUS THEREOF

BACKGROUND OF THE INVENTION

1. Field of the Invention

The present invention relates to an external data storage subsystem, and, more particularly, to a method and apparatus for storing parity and rebuilding the data contents of failed disks in a disk array.

2. Description of the Related Art

A conventional computer hard disk does not currently balance its operational speed with the speeds of its microprocessor and memory because of the hard disks inherent mechanical characteristics. Microprocessors and memories have significantly enhanced their capacities with the development of semiconductor technology. Whereas, data access time of the hard disk is reduced by less than about 10% per year while the RISC (Reduced Instruction Set Computer) microprocessor has its performance enhanced by more than 50% per year. Hence, the performance of a computer system is degraded with low performance the I/O subsystem based on the hard disk.

Patterson et al, "A Case for Redundant Arrays of Inexpensive Disks (RAID)", Chicago ACM SIGMOD Conf. Report, pp. 109–116, published in 1988, disclosed 6 levels of disk arrays from 0 level to 5 level, classified according to structure and characteristics of the disk array. RAID is composed of a plurality of disks that provide large capacity, make it possible to parallel process to secure high performance, and employ the redundancy to rebuild the data contents of failed disks.

The number of the disks constituting a disk array may be increased in order to store multimedia data together with conventional text data. However, this increases the rate of failure of reading the disks. For example, if the mean time to undergo a failure in reading a single disk is defined as MTTF (Mean Time To Failure), a disk array composed of n disks has the mean time to failure of MTTF/n. In order to secure high reliability of performance with increasing the number of disks constituting a disk array, RAID level 6 is required to rebuild the data contents of two failed disks, for example. RAID level 6 is disclosed in "RAID: High-Performance, Reliable Secondary Storage", reported by Patterson et al, in ACM Computing Surveys, vol. 26, pp. 109–116, published in June, 1994. The data errors of the disk may be in addition to system failure, uncorrectable bit errors, environmental factors, etc. The level 6 defined by Patterson et al. employs reed solomon code, the complexity of which requires high maintenance cost as well as additional hardware.

The method to rebuild the data contents of two failed disks includes a two dimensional parity technique, EVENODD technique, and a redundancy matrix technique. The two dimensional parity technique is disclosed in an article entitled as "Coding Techniques for Handling Failures in Large Disk Arrays" by Patterson et al, Computer Science Tech. Report CSD88-477, Univ. of California, Berkeley, published in December, 1988, where the structure of RAID level 4 is expanded to arrange parity disks both transversely and longitudinally. This technique suffers from two drawbacks, one of which bottlenecks the parity disks because of their undistributed state and the other is it increases the parity disk overhead.

The EVENODD technique is disclosed in an article entitled "EVENODD: An Efficient Scheme for Tolerating Double Disk Failures in RAID Architectures" by Blaum et al, IEEE Trans. on Computers, vol. 44, no. 2, pp. 192–202 issued in February, 1995, which is characterized by employing optimum parity disks. Namely, if m (a prime number) disks are used as data disks, only two parity disks may be added, thus minimizing the parity disk overhead. This technique, however, may degrade performance due to bottlenecks as described in the previous two dimensional technique as well as reducing the mean time to data loss (MTTDL) which is inversely proportional to the size of the error correction group. In addition, overhead exists for maintaining the data blocks of each diagonal line. Namely, when a writing operation is performed on the diagonal data blocks of each disk, all the values of the blocks of the diagonal parity disk must be updated.

U.S. Pat. Nos. 5,271,012 and 5,351,246 respectively entitled "Method and Means for Encoding and Rebuilding Data Contents of up to Two Unavailable DASDS in an Array of DASDS" and "Method and Means for Coding and Rebuilding that Data Contents of Unavailable DASDS in Error in the Presence of Reduced Number of Unavailable DASDS in a DASD Array" issued to Blaum et al respectively on Dec. 14, 1993 and Sep. 27, 1994, use diagonal parity and row parity to encode the disk array and rebuild the data contents of two failed disks. However, these patents have the same drawbacks as described for the EVENODD technique, above.

The redundancy matrix technique is disclosed in an article entitled "Efficient Placement of Parity and Data to Tolerate Two Disk Failures in Disk Array Systems" by Chan-Ik Park, IEEE Trans. on Parallel and Distributed Systems, vol. 6, no. 11, pp. 1177–1184, published in November, 1995, where parity blocks are distributed by defining N disks as an $N^*N$ redundancy matrix in order to resolve the bottleneck problem for the parity disks inherently existing in such methods as the two dimensional parity technique, etc. This technique may rebuild the data contents of two failed disks provided the redundancy matrix meets a certain criteria. Although this resolves the bottleneck problem caused by the overhead of the parity disk, by distributing the parity and data blocks according to a disposing algorithm, the redundancy matrix technique incurs additional cost and overhead due to the complexity of the algorithm and the redundant matrix. In addition, an expansion requires rearrangement according to the algorithm.

SUMMARY OF THE INVENTION

It is an object of the present invention to provide a method and apparatus for rebuilding the data contents of a two failed disks in a disk array and eliminating the performance degradation caused by bottlenecking of parity disks.

It is another object of the present invention to provide a method and apparatus for reducing the time taken for rebuilding failed disks.

It is still another object of the present invention to provide a method and apparatus for eliminating performance degradation caused by frequent disk access to update the contents of data disks.

It is a further object of the present invention to provide a method and apparatus for rebuilding the data contents of failed disks in parallel.

According to one aspect of the present invention, a method for storing parity and rebuilding the data contents of two failed disks in an external storage subsystem comprises the steps of: constituting a disk array defined as a matrix of $(N-1)^*N$ comprising N disks each logically divided into N−1 data blocks where N is a prime number, the data blocks of a row being defined as a horizontal parity group, the data blocks existing in a rightwardly and upwardly continuous diagonal line being defined as a diagonal parity group; defining the data blocks existing in the diagonal line leftwardly and downwardly from the first data block of the (N−1) disk to the last data block of the first disk as the horizontal parity blocks; defining the data blocks existing in the (N−1) row of the matrix as the diagonal parity blocks; exclusive OR'ing (XORing) the contents of each of the horizontal and diagonal parity groups to obtain the parity value stored into the parity block of the corresponding horizontal or diagonal parity group; and analyzing a diagonal parity group including one of error data blocks of the two failed disks to restore the one error data block and the horizontal parity group including the restored one error data block to restore another error data block, wherein the last analyzing step is repeated to completely rebuild the data contents of the two failed disks.

According to another aspect of the present invention, a method for storing parity and rebuilding the data contents of two failed disks in an external storage subsystem comprises the steps of: providing a disk array defined as a matrix of $(N-1)*(N+1)$ including N+1 disks each logically divided into N−1 data blocks where N is a prime number, the data blocks of a row being defined as a horizontal parity group, the data blocks except the data blocks of the last (N+1) disk existing in a rightwardly and upwardly continuous diagonal line being defined as a diagonal parity group; defining the data blocks of the last disk as the horizontal parity blocks; defining the data blocks existing in the (N−1) row of the matrix as the diagonal parity blocks; XORing the contents of each of the horizontal and diagonal parity groups to obtain the parity value stored into the parity block of the corresponding horizontal or diagonal parity group; and analyzing a diagonal parity group including one of error data blocks of the two failed disks to restore the one error data block and the horizontal parity group including the restored one error data block to restore another error data block, wherein the last analyzing step is repeated to completely rebuilt the data contents of the two failed disks.

The present invention will now be described more specifically with reference to the drawings attached by way of example.

DETAILED DESCRIPTION OF PREFERRED EMBODIMENTS

Figure 1:
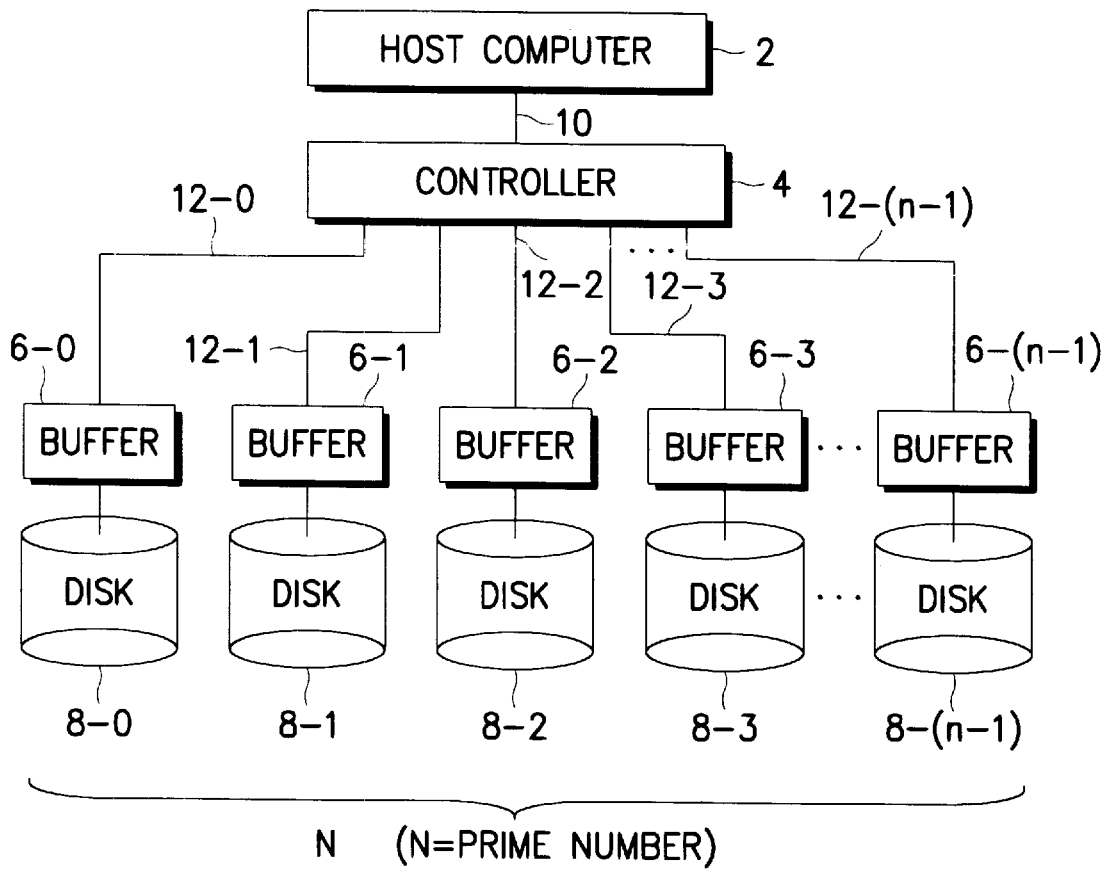
FIG. 1 is a block diagram illustrating the structure of a disk array arranged according to a DH (diagonal and horizontal) parity arrangement according to an embodiment of the present invention.

An inventive DH parity arrangement distributes the parities of a disk array to eliminate bottlenecking of data processing, and employs an XOR operation to rebuild data contents of two failed disks, thus improving the performance of the disk array. The same reference numerals are used to represent the same elements throughout the accompanying drawings. Detailed descriptions of conventional functions and elements are omitted for clear understanding of the invention.

Hereinafter, a DH parity arrangement is described with reference to FIGS. 1, 5 to 7, 11 to 14, 19, and 20A to 20G, and a DH2 parity arrangement is described with reference to FIGS. 2, 4, 8 to 10, 15 to 18, 21, and 22A to 22G.

DH Parity Arrangement

Referring to FIG. 1, a controller 4 receiving an I/O request from a host computer 2 includes a unit for performing an encoding and decoding algorithm of the DH parity arrangement and a processor for performing XOR operations to control a disk array composed of N disks 8-0 to 8-(N−1) where N is a prime number. Each of the disks is structured with data and parity blocks according to the DH arrangement. A plurality of high performance buffers 6-0 to 6-(N−1) is provided to reduce disk access time of the controller 4 to the disks. The host computer 2 is connected to the controller 4 by means of the system bus 10. There are also provided I/O buses 12-0 to 12-(N−1) between the controller 4 and buffers 6-0 to 6-(N−1) and disks 8-0 to 8-(N−1).

Referring to FIGS. 3 and 12 to 14, a structure of the DH parity arrangement (Definition 1), horizontal parity blocks and groups (Definition 2), diagonal parity blocks and groups (Definition 3), and data arrangement according to the above definitions are shown. A more detailed description follows.

Definition 1

Structure of DH Parity Arrangement

If a disk array includes N (prime number) disks, and each of the disks is logically divided into N−1 blocks, then it is defined as a matrix $a_{(i,j)}$ of $(N-1)^*N$, where $0 \leq i \leq N-2$ and $0 \leq j \leq N-1$. Table 1 shows the elements of matrix $a_{(i,j)}$.

TABLE 1

| $a_{(0,0)}$ | $a_{(0,1)}$ | ... | $a_{(0,j)}$ | ... | $a_{(0,N-1)}$ |
|---|---|---|---|---|---|
| $a_{(1,0)}$ | $a_{(1,1)}$ | ... | $a_{(1,j)}$ | ... | $a_{(1,N-1)}$ |
| $a_{(2,0)}$ | $a_{(2,1)}$ | ... | $a_{(2,j)}$ | ... | $a_{(2,N-1)}$ |
| ... | ... | ... | ... | ... | ... |
| $a_{(i,0)}$ | $a_{(i,1)}$ | ... | $a_{(i,j)}$ | ... | $a_{(i,N-1)}$ |
| ... | ... | ... | ... | ... | ... |
| $a_{(N-2,0)}$ | $a_{(N2,1)}$ | ... | $a_{(N2,j)}$ | ... | $a_{(N-2,N-1)}$ |

Matrix $a_{(i,j)}$ represents the data value of the logical block i of the disk j, which contains a binary number therein. In this case, the logical blocks $a_{(N-2,0)}, a_{(N-2,1)}, \ldots, a_{(N-2,N-1)}$ of the (N−1) row of the disks are the diagonal parity blocks for storing diagonal parities, the logical blocks $a_{(0,N-2)}$, $a_{(1,N-3)}, a_{(2,N-4)}, \ldots, a_{(N-3,1)}, a_{(N-2,0)}$ diagonally from the first block $a_{(0,N-2)}$ of the (N−1) disk to the last block $a_{(N-2,0)}$ of the first disk are the horizontal parity blocks for storing the parity values of the rows, and the remaining blocks are the data blocks for storing data.

Definition 2

Horizontal Parity Groups and Blocks in DH Parity Arrangement

The data blocks of each row of the matrix $a_{(i,j)}$ defined by Definition 1 as representing a disk array are defined as an error correction group of horizontal parities (hereinafter referred to as a "horizontal parity group"), and the blocks existing diagonally from the last block of the first disk to the first block of the (N−1) are defined as the horizontal parity blocks. Each of the horizontal parity blocks stores the XOR'ed value of the remaining blocks of its corresponding row. Namely, the parity value of each horizontal parity group is stored in the block $a_{(i,N-2-i)}$ where $0 \leq i \leq N-2$.

Figure 3:
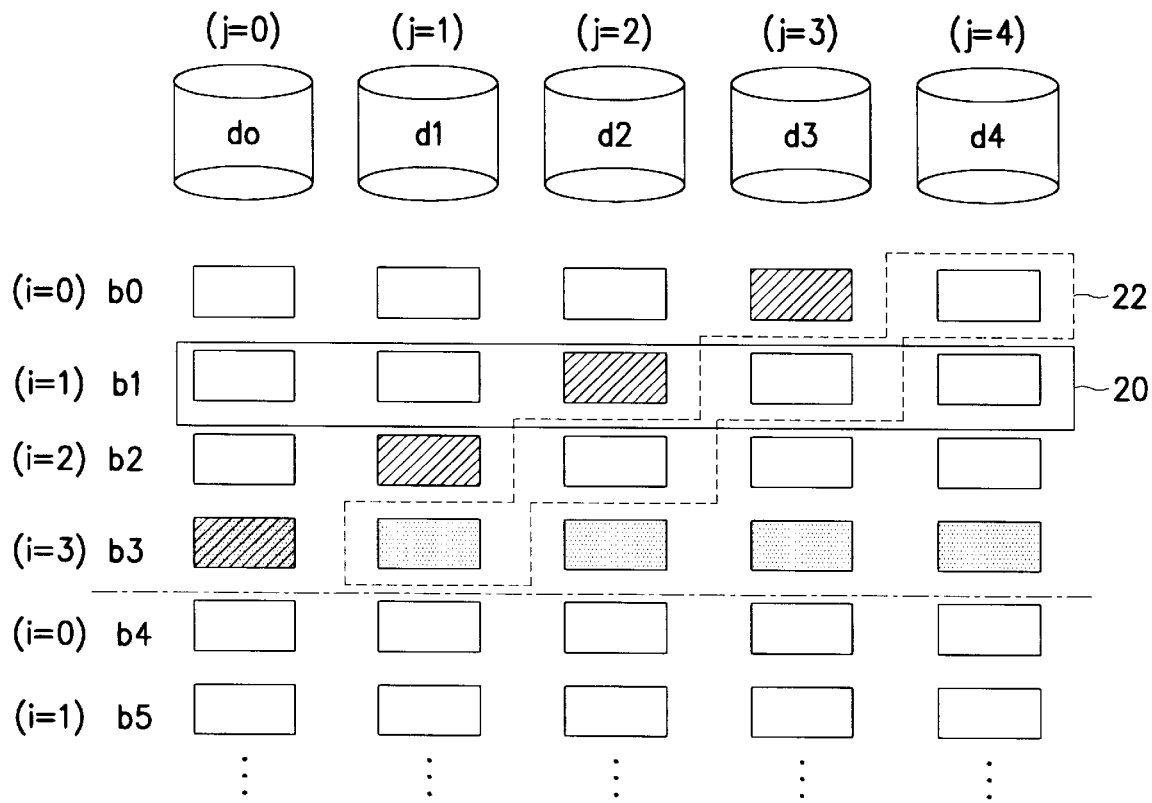
FIG. 3 is a schematic diagram illustrating diagonal and horizontal parity groups together having parity blocks according to the DH arrangement of FIG. 1.
Figure 3:
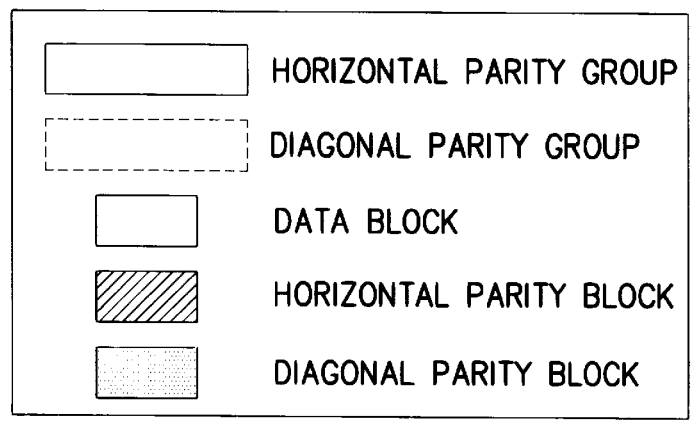
Figure 5:
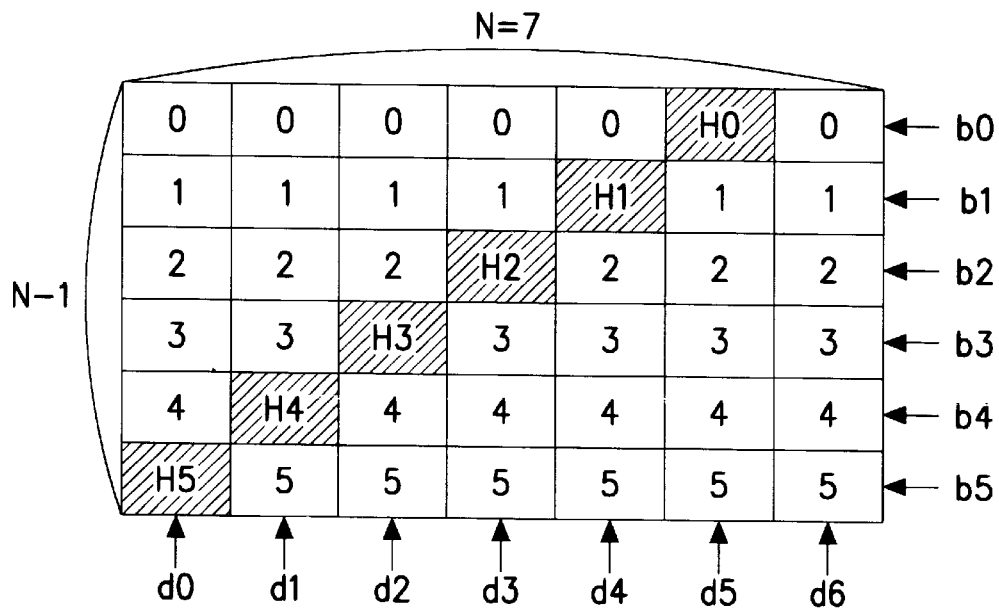
FIG. 5 is a map illustrating an inventive DH arrangement of the horizontal parity groups and blocks with the number of disks N=7.

Referring to FIG. 3, there is shown a disk array consisting of five disks (N=5) d0 to d4, each of which is logically divided into four blocks (N−1=4) b0–b3, b4–b7, ..., b16–b19. Hence, there are formed four horizontal parity groups. The reference numeral 20 represents a horizontal parity group including the second block b1. The hatched blocks represent the horizontal parity blocks expressed by $a_{(i,N-2-i)}$. Namely, these are $a_{(3,0)}, a_{(2,1)}, a_{(1,2)}$, and $a_{(0,3)}$ in case of N=8. FIG. 5 shows the horizontal parity group Nos. 0, 1, 2, 3, 4 and 5 of DH parity arrangement in case of N=7, where the hatched blocks H0 to H5 represent the horizontal parity blocks of the horizontal parity groups.

Definition 3

Diagonal Parity Groups and Blocks in DH Parity Arrangement

Figure 6:
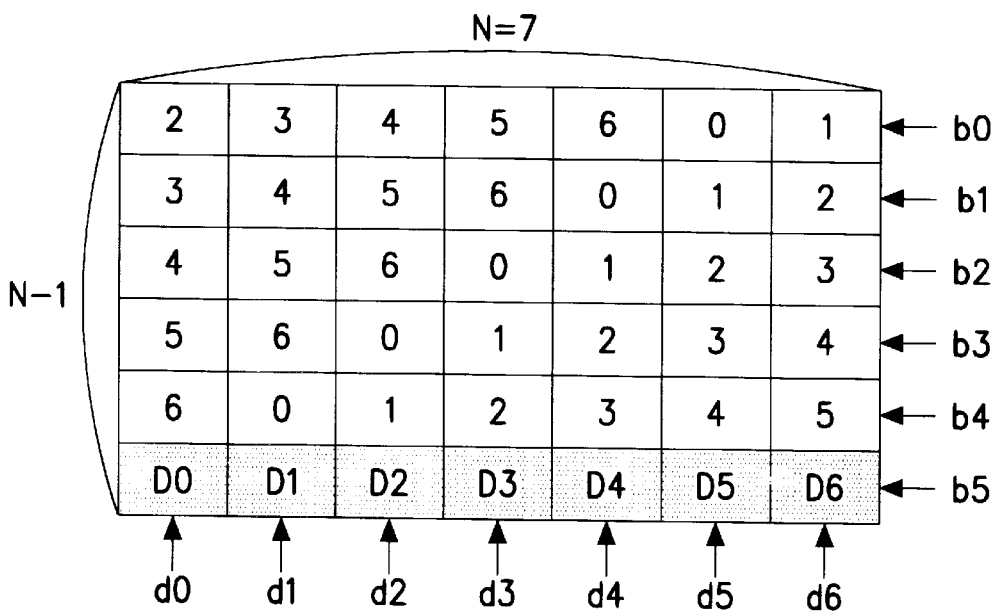
FIG. 6 is a map illustrating the inventive DH arrangement of the diagonal parity groups and blocks with the number of disks N=7.

The data blocks existing in the (N−1) row of the matrix $a_{(i,j)}$ of $(N-1)^*N$ as defined by Definition 1 are defined as the diagonal parity blocks for storing diagonal parity values. The data blocks existing in each rightwardly and upwardly closed looped diagonal line are defined as an error correction group of diagonal parities (hereinafter referred to as a "diagonal parity group"). The blocks existing in the diagonal line starting from the last block of the first disk are defined as the first diagonal parity group. The parity values of the parity groups are stored respectively into the diagonal parity blocks expressed by $a_{(N-2,j)}$ where $0 \leq j \leq N-1$. Referring to FIG. 3, the blocks enclosed in the slotted line indicated by reference numeral 22 represent the second parity group. In addition, the blocks of the fourth row i=3 (N−1) marked with dots represent the diagonal parity blocks to respectively store the parity values of the diagonal parity groups. FIG. 6 illustrates the diagonal parity groups with identification numbers for the case of N=7, where the blocks D0 to D6 marked with dots represent the diagonal parity blocks.

Figure 7:
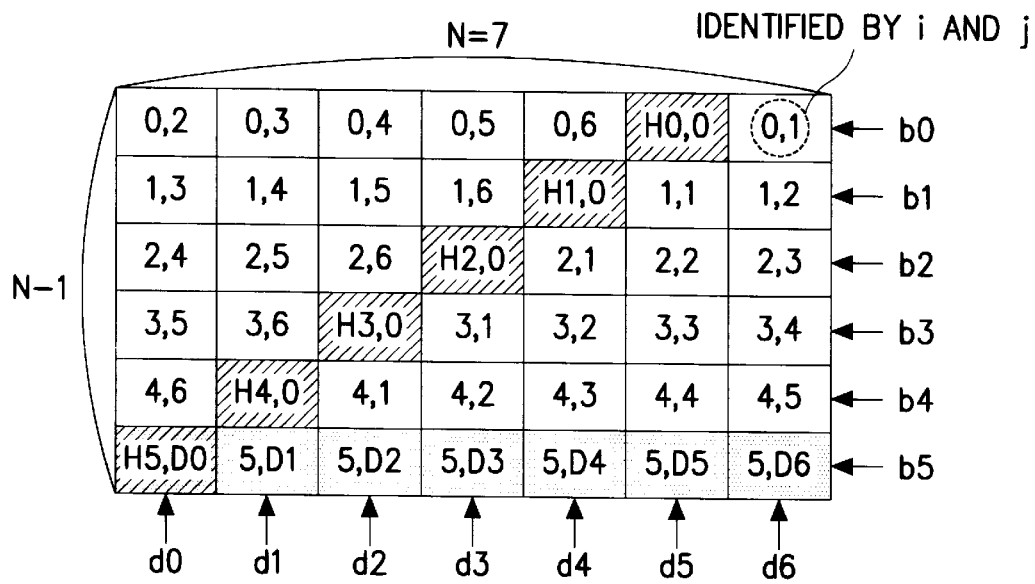
FIG. 7 is a map illustrating the inventive DH arrangement of the parity and data with the number of disks N=7.

The blocks, except the horizontal and diagonal parity blocks as defined by Definitions 2 and 3, are called the data blocks to store actual data. FIG. 7 depicts the arrangement of the parities and data in the form of a matrix in the case of N=7 in the DH parity arrangement. Reference numerals H0 to H5 represent the horizontal parity blocks of the horizontal parity group Nos. 0 to 5, and D0 to D6 represent the diagonal parity blocks of the diagonal parity group Nos. 0 to 6. Each of the data blocks is identified by numbers in the form of i, j, where i represents the horizontal parity groups and j the diagonal parity groups.

Figure 11:
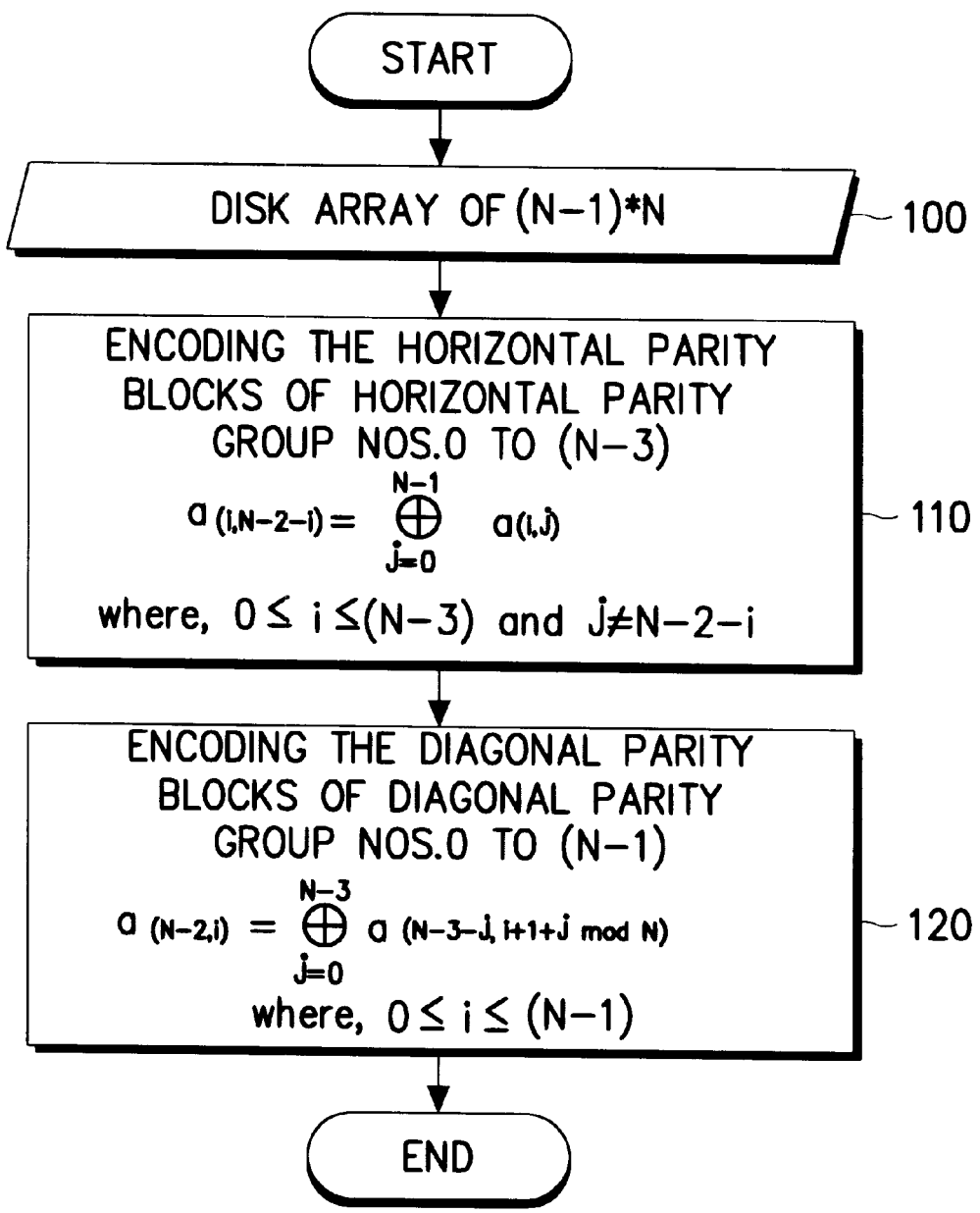
FIG. 11 is a flow chart illustrating the steps of a parity storing algorithm according to the inventive DH arrangement.

The parity storage algorithm of the DH parity arrangement provides a method for obtaining the parity values of the data blocks of the parity groups by XOR'ing, as shown in FIG. 11, where a disk array of $(N-1)^*N$ is controlled by the controller 4 (see FIG. 1) to store the horizontal and diagonal parities respectively through steps 110 and 120. Namely, in step 110, the controller 4 calculates the horizontal parities of the horizontal parity groups Nos. 0 to (N−−3) to encode the horizontal parity blocks with the corresponding horizontal parities. The horizontal parities are calculated by the following Formula 1:

$$a_{(i,N-2-i)} = \bigoplus_{j=0}^{N-1} a_{(i,j)} \tag{1}$$

Where $0 \leq i \leq (N-3)$ or $j \neq N-2-i$

In step 120, the controller calculates the diagonal parities of the diagonal parity group Nos. 0 to (N−1) to encode the diagonal parity blocks with the corresponding diagonal parities. The diagonal parities are calculated by the following Formula 2:

$$a_{(N-2,i)} = \bigoplus_{j=0}^{N-3} a_{(N-3-j, i+1+j \bmod N)} \quad (2)$$

Where $$0 \leq i \leq (N-1)$$

The process for calculating the horizontal and diagonal parities by Formulae 1 and 2 are described with reference to FIGS. 12 to 14, where the number of the disks N=7.

Storing Parities According to DH Parity Arrangement in Case of N=7

Table 2 shows a matrix of a disk array composed of seven disks (N=7), each disk has blocks identified by corresponding element numbers of the matrix to be used for encoding and decoding in the DH parity arrangement.

TABLE 2

| $a_{(0,0)}$ | $a_{(0,1)}$ | $a_{(0,2)}$ | $a_{(0,3)}$ | $a_{(0,4)}$ | $a_{(0,5)}$ | $a_{(0,6)}$ |
|---|---|---|---|---|---|---|
| $a_{(1,0)}$ | $a_{(1,1)}$ | $a_{(1,2)}$ | $a_{(1,3)}$ | $a_{(1,4)}$ | $a_{(1,5)}$ | $a_{(1,6)}$ |
| $a_{(2,0)}$ | $a_{(2,1)}$ | $a_{(2,2)}$ | $a_{(2,3)}$ | $a_{(2,4)}$ | $a_{(2,5)}$ | $a_{(2,6)}$ |
| $a_{(3,0)}$ | $a_{(3,1)}$ | $a_{(3,2)}$ | $a_{(3,3)}$ | $a_{(3,4)}$ | $a_{(3,5)}$ | $a_{(3,6)}$ |
| $a_{(4,0)}$ | $a_{(4,1)}$ | $a_{(4,2)}$ | $a_{(4,3)}$ | $a_{(4,4)}$ | $a_{(4,5)}$ | $a_{(4,6)}$ |
| $a_{(5,0)}$ | $a_{(5,1)}$ | $a_{(5,2)}$ | $a_{(5,3)}$ | $a_{(5,4)}$ | $a_{(5,5)}$ | $a_{(5,6)}$ |

Figure 12:
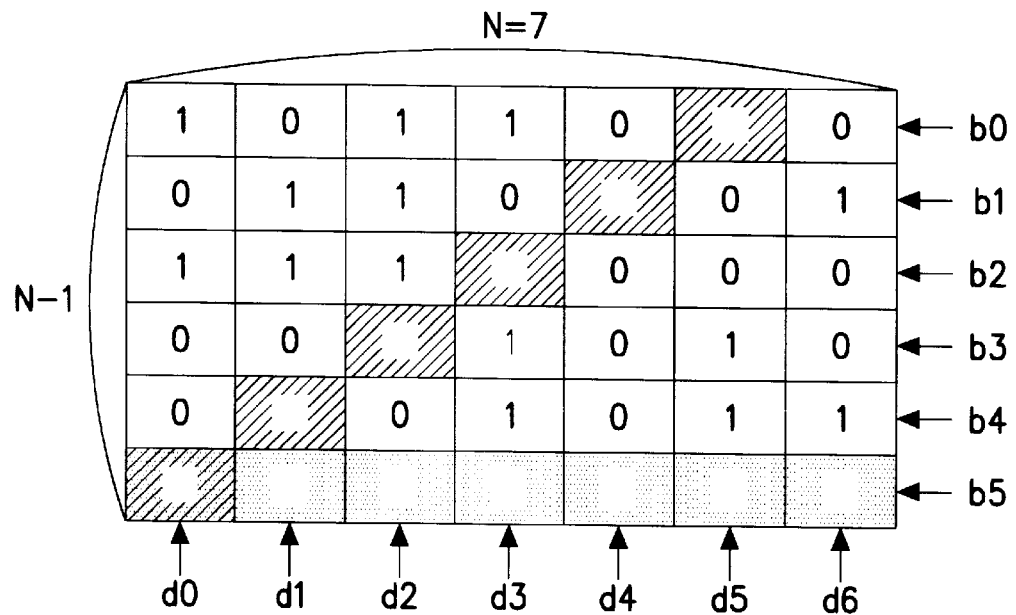
FIGS. 12 to 14 are maps illustrating a process of storing the parities according to an inventive DH arrangement with the number of disks N=7.
Figure 13:
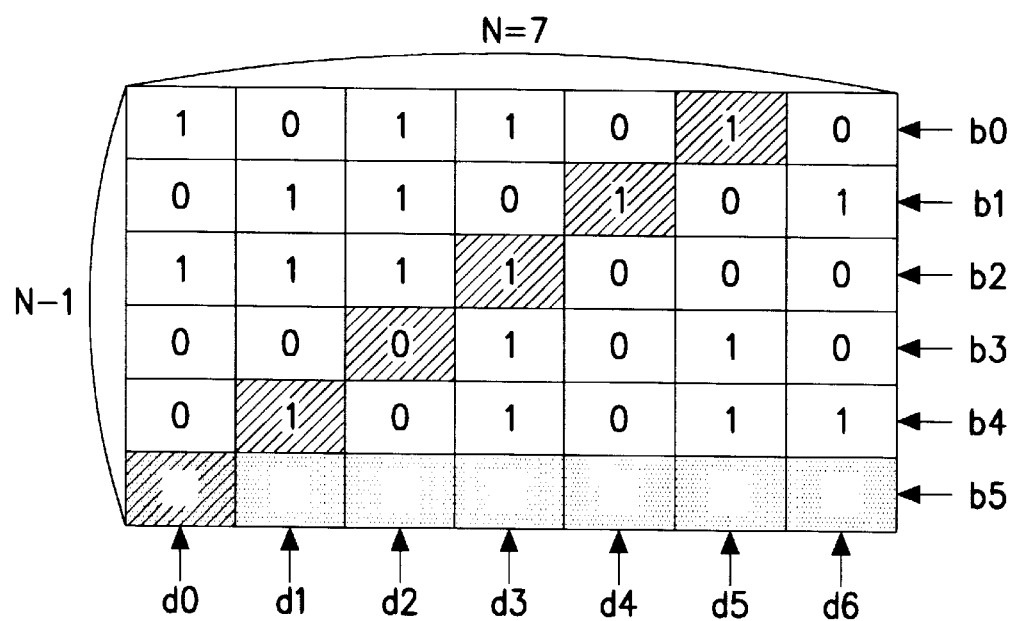

FIG. 12 illustrates the data blocks of the matrix as shown in Table 2, where binary data are stored in the data blocks. After XOR'ing by Formulae 1 and 2, the horizontal parities are stored into the hatched blocks and the diagonal parities into the dotted blocks. The horizontal parities of the horizontal parity blocks $a_{(0,5)}$, $a_{(1,4)}$, $a_{(2,3)}$, $a_{(3,2)}$ and $a_{(4,1)}$ are obtained by using Formula 1 as follows:

$a_{(0,5)} = a_{(0,0)} \oplus a_{(0,1)} \oplus a_{(0,2)} \oplus a_{(0,3)} \oplus a_{(0,4)} \oplus a_{(0,6)} = 1 \oplus 0 \oplus 1 \oplus 1 \oplus 0 \oplus 0 = 1$ $a_{(1,4)} = a_{(1,0)} \oplus a_{(1,1)} \oplus a_{(1,2)} \oplus a_{(1,3)} \oplus a_{(1,5)} \oplus a_{(1,6)} = 0 \oplus 1 \oplus 1 \oplus 0 \oplus 0 \oplus 1 = 1$ $a_{(2,3)} = a_{(2,0)} \oplus a_{(2,1)} \oplus a_{(2,2)} \oplus a_{(2,4)} \oplus a_{(2,5)} \oplus a_{(2,6)} = 1 \oplus 1 \oplus 1 \oplus 0 \oplus 0 \oplus 0 = 1$ $a_{(3,2)} = a_{(3,0)} \oplus a_{(3,1)} \oplus a_{(3,3)} \oplus a_{(3,4)} \oplus a_{(3,5)} \oplus a_{(3,6)} = 0 \oplus 0 \oplus 1 \oplus 0 \oplus 1 \oplus 0 = 0$ $a_{(4,1)} = a_{(4,0)} \oplus a_{(4,2)} \oplus a_{(4,3)} \oplus a_{(4,4)} \oplus a_{(4,5)} \oplus a_{(4,6)} = 0 \oplus 0 \oplus 1 \oplus 0 \oplus 1 \oplus 1 = 1$ The horizontal parities 1, 1, 1, 0, 1 thus obtained are stored into their respective horizontal parity blocks $a_{(0,5)}$, $a_{(1,4)}$, $a_{(2,3)}$, $a_{(3,2)}$ and $a_{(4,1)}$ as shown in FIG. 13.

Figure 14:
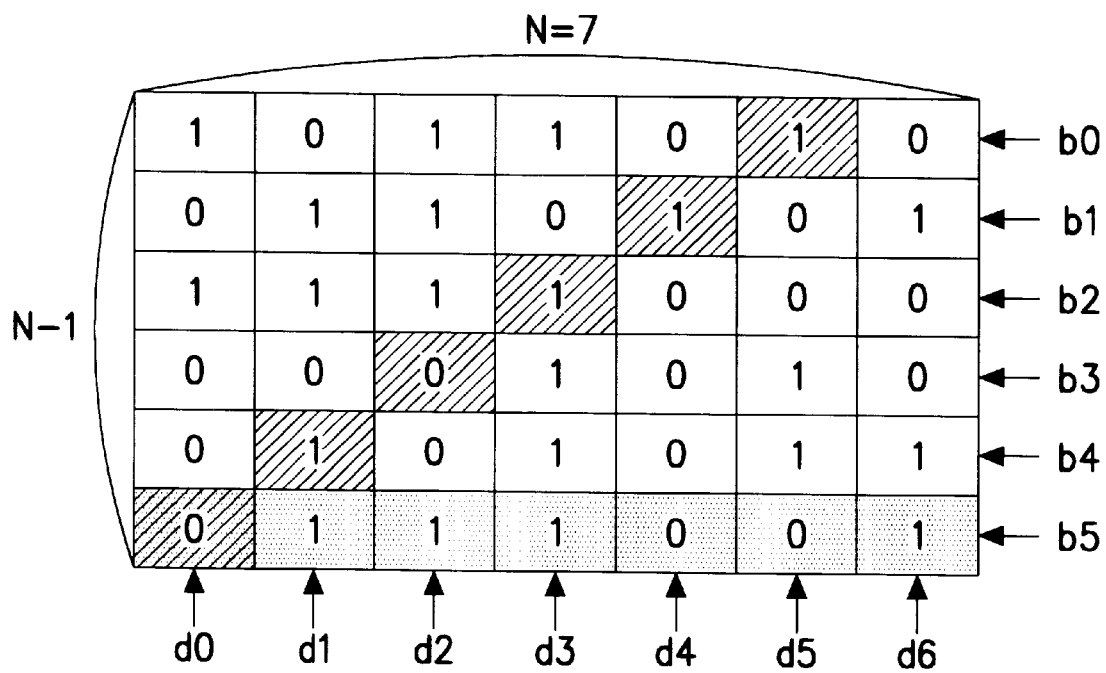

In addition, the diagonal parities of the diagonal parity blocks $a_{(5,0)}$, $a_{(5,1)}$, $a_{(5,2)}$, $a_{(5,3)}$, $a_{(5,4)}$, $a_{(5,5)}$ and $a_{(5,6)}$ are obtained by using Formula 2 as follows:

$a_{(5,0)} = a_{(4,1)} \oplus a_{(3,2)} \oplus a_{(2,3)} \oplus a_{(1,4)} \oplus a_{(0,5)} = 1 \oplus 0 \oplus 1 \oplus 1 \oplus 1 = 0$ $a_{(5,1)} = a_{(4,2)} \oplus a_{(3,3)} \oplus a_{(2,4)} \oplus a_{(1,5)} \oplus a_{(0,6)} = 0 \oplus 1 \oplus 0 \oplus 0 \oplus 0 = 1$ $a_{(5,2)} = a_{(4,3)} \oplus a_{(3,4)} \oplus a_{(2,5)} \oplus a_{(1,6)} \oplus a_{(0,0)} = 1 \oplus 0 \oplus 0 \oplus 1 \oplus 1 = 1$ $a_{(5,3)} = a_{(4,4)} \oplus a_{(3,5)} \oplus a_{(2,6)} \oplus a_{(1,0)} \oplus a_{(0,1)} = 0 \oplus 1 \oplus 0 \oplus 0 \oplus 0 = 1$ $a_{(5,4)} = a_{(4,5)} \oplus a_{(3,6)} \oplus a_{(2,0)} \oplus a_{(1,1)} \oplus a_{(0,2)} = 1 \oplus 0 \oplus 1 \oplus 1 \oplus 1 = 0$ $a_{(5,5)} = a_{(4,6)} \oplus a_{(3,0)} \oplus a_{(2,1)} \oplus a_{(1,2)} \oplus a_{(0,3)} = 1 \oplus 0 \oplus 1 \oplus 1 \oplus 1 = 0$ $a_{(5,6)} = a_{(4,0)} \oplus a_{(3,1)} \oplus a_{(2,2)} \oplus a_{(1,3)} \oplus a_{(0,4)} = 0 \oplus 0 \oplus 1 \oplus 0 \oplus 0 = 1$ The horizontal and diagonal parities thus obtained are stored in the horizontal and diagonal parity blocks as shown in FIG. 14, where N=7.

With the inventive DH parity arrangement, it is possible to rebuild the data contents of a single failed disk by using the horizontal or diagonal parities. The data contents of two failed disks may be rebuilt by alternate application of the horizontal and diagonal parities. For example, if one of the horizontal parity groups of a disk array including N(=prime number) disks has an error block, the data of the remaining N−1 blocks are XOR'ed to rebuild the data content of the error block.

Each diagonal parity group includes N−1 blocks distributed among different disks. Hence, if two of the N disks have failed, there is at least one diagonal parity group including a single error block. Decoding the single error block makes it possible to decode the remaining error block included in the horizontal parity block which includes the single error block. Subsequently, the remaining error block decoded constitutes a block of another diagonal parity group, so that the remaining error block is recorded in the other diagonal parity group. In this way, the data contents of the two failed disks of a disk array including N(=prime number) disks may be rebuilt by alternate application of the horizontal and diagonal parities.

Figure 19:
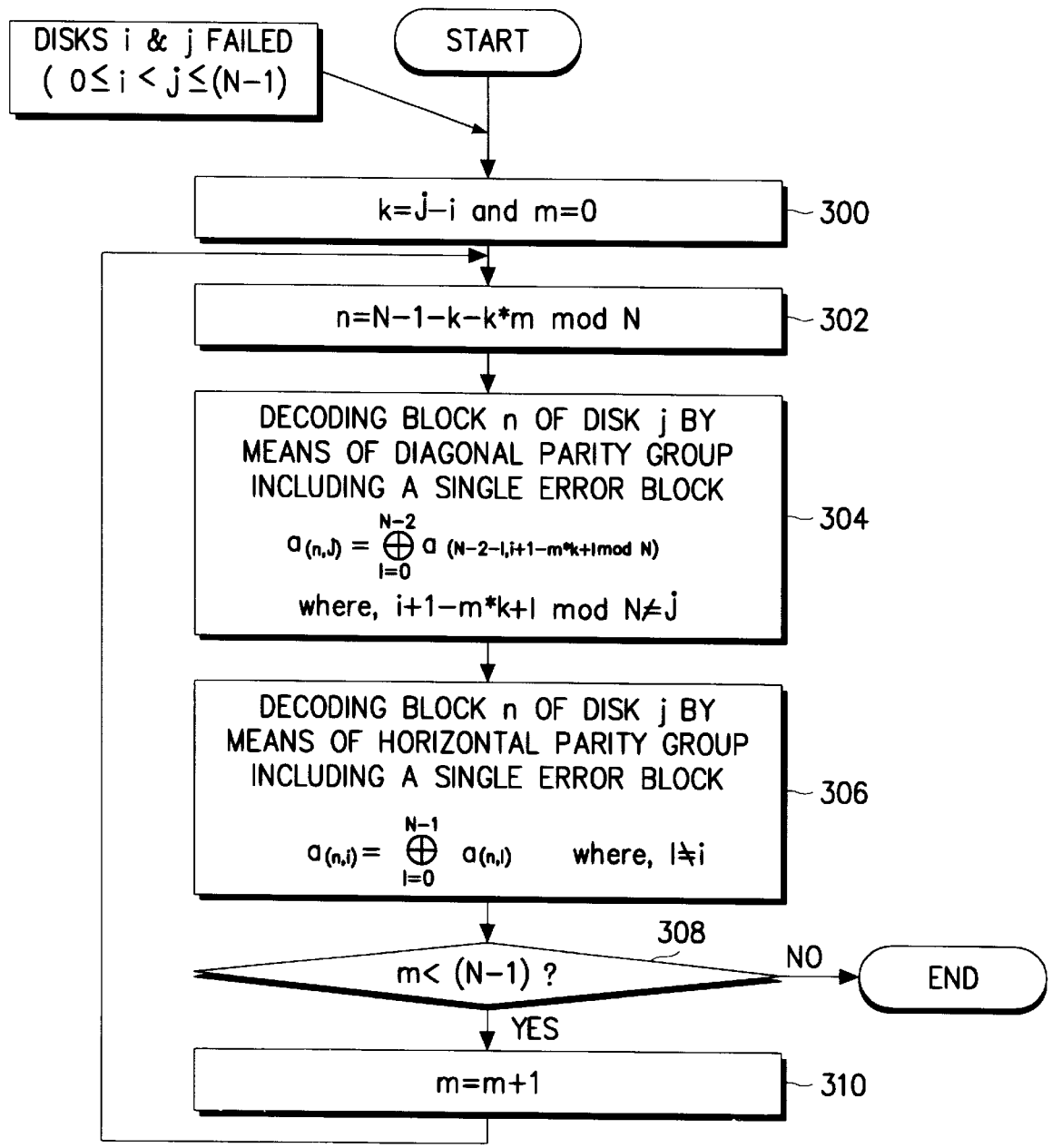
FIG. 19 is a flow chart illustrating the steps of a decoding algorithm with two failed disks according to the inventive DH arrangement.

Referring to FIG. 19, the process of decoding two failed disks i and j by alternate application of the diagonal and horizontal parities includes a first step of obtaining a difference k between the numbers i and j. Then, the block of the disk j belonging to the diagonal parity group including the diagonal parity block of the disk (i+1) is decoded. Subsequently decoded is the block of the disk i by means of the horizontal parity group including the decoded block of the disk j. The same decoding steps are repeated until all the blocks of the two failed disks are rebuilt. The algorithm by which the controller 4, as shown in FIG. 1, decodes all the blocks of two failed disks is more specifically described with reference to FIG. 19, where the following assumption is used.

ASSUMPTION: Disks i and j failed ($0 \leq i < j \leq (N-1)$)

The controller 4, in step 300, sets k=j−i and m=0. The difference between the disks i and j is first obtained, and "m" is initialized to "0" which is a parameter used to determine the number of repetitions of the performed decoding steps.

In step 302, the following value "n" is obtained:
n=N−1−m*k mod N

As described above, since each parity group includes N−1 blocks distributed among different disks, at least one diagonal group includes a single error block if the failure of two disks occurs. Hence, the value "n" represents the error block of the disk j belonging to the diagonal parity group including a single error block. Then, the controller 4 decodes the error block "n" of the disk j by means of the diagonal parity group in step 304. The value $a_{(n,j)}$ of the error block "n" of the disk j is obtained by Formula 3.

$$a_{(n,j)} = \bigoplus_{l=0}^{N-2} a_{(N-2-l, i+1-m*k+l \bmod N)} \quad (3)$$

Where i+1−m*k+1 mod N j

In step 306, the controller 4 decodes the error block "n" of the disk i by means of the horizontal parity block including the decoded block "n" of the disk j obtained in step

304. The value $a_{(n,i)}$ of the error block "n" of the disk i is obtained by Formula 4.

$$a_{(n,i)} = \bigoplus_{l=0}^{N-1} a_{(n,l)} \quad (4)$$

Where 1 i

Thereafter, a decision is made in step 308 whether m<(N−1), and if so, "1" is added to "m" (m=m+1) in step 310, and then, the process is returned to the step 302.

Describing more specifically the process of rebuilding the data contents of two failed disks of a disk array including N(=prime number) disks with reference to FIGS. 20A to 20G, the DH parity arrangement is similar to that of FIG. 14, and the second disk d1(i=1) and the fourth disk d3(j=3) are failed.

<Process of Rebuilding the Data Contents of Two Failed Disks according to DH Parity Arrangement in case of N=7>

Figure 20A:
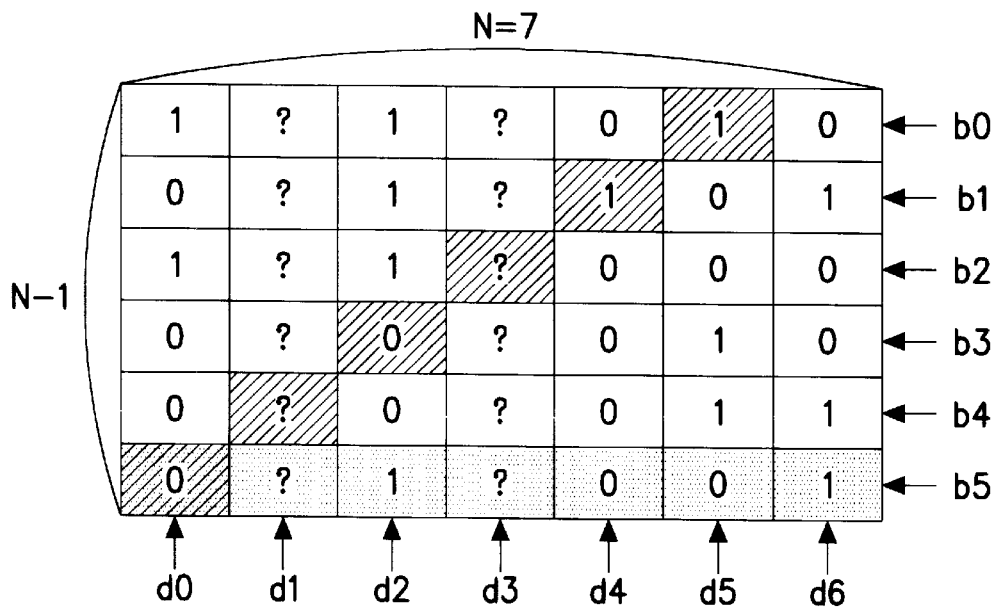
FIGS. 20A to 20G are maps illustrating a process of rebuilding data contents with two failed disks according to the inventive DH arrangement.

The matrix of FIG. 20A illustrates the second and fourth disks failed in the disk array of FIG. 14, where i=1, j=3, and therefore, k=2. Hence, n=N−1−k−k*m mod N=7−1−2−2m mod 7=4−2m mod 7. Therefore, Formula 3, to obtain the value of block "n" of the disk j in step 304 of FIG. 19, may be rewritten as Formula 5, and Formula 4, to obtain the value of block "n" of the disk i in step 306 of FIG. 19, may be rewritten as Formula 6.

$$a_{(4-2m\bmod 7, 3)} = \bigoplus_{l=0}^{5} a_{(5-1, 2-2m+1 \bmod 7)} \quad (5)$$

$$a_{(4-2m\bmod 7, 1)} = \bigoplus_{l=0}^{6} a_{(4-2m\bmod 7, l)} \quad (6)$$

Figure 20B:
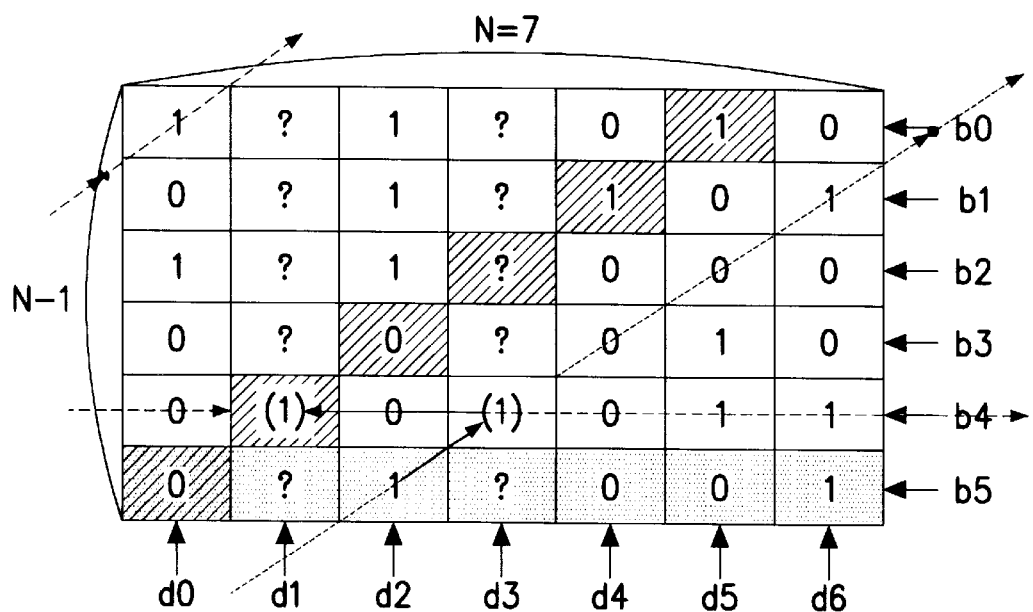

Accordingly, Formuale 5 and 6 may be respectively expressed with m=0 as follows:

$a_{(4,3)}=a_{(5,2)} \oplus a_{(3,4)} \oplus a_{(2,5)} \oplus a_{(1,6)} \oplus a_{(0,0)}=1 \oplus 0 \oplus 1 \oplus 1=1$ $a_{(4,1)}=a_{(4,0)} \oplus a_{(4,2)} \oplus a_{(4,3)} \oplus a_{(4,4)} \oplus a_{(4,5)} \oplus a_{(4,6)}=$
    $0 \oplus 0 \oplus 1 \oplus 0 \oplus 1 \oplus 1=1$ In this case, it will be noted that $a_{(4,3)}$ represents the fifth block (n=4) of the fourth failed disk (j=3), obtaining its value "1" by XOR'ing the remaining blocks of its diagonal parity group. Likewise, $a_{(4,1)}$ represents the fifth block (n=4) of the second failed disk (i=1), obtaining its value "1" by XOR'ing the remaining blocks of its horizontal parity group. These decoded values "1" and "1" obtained by alternate application of the diagonal and horizontal parity groups are shown in FIG. 20B.

Figure 20C:
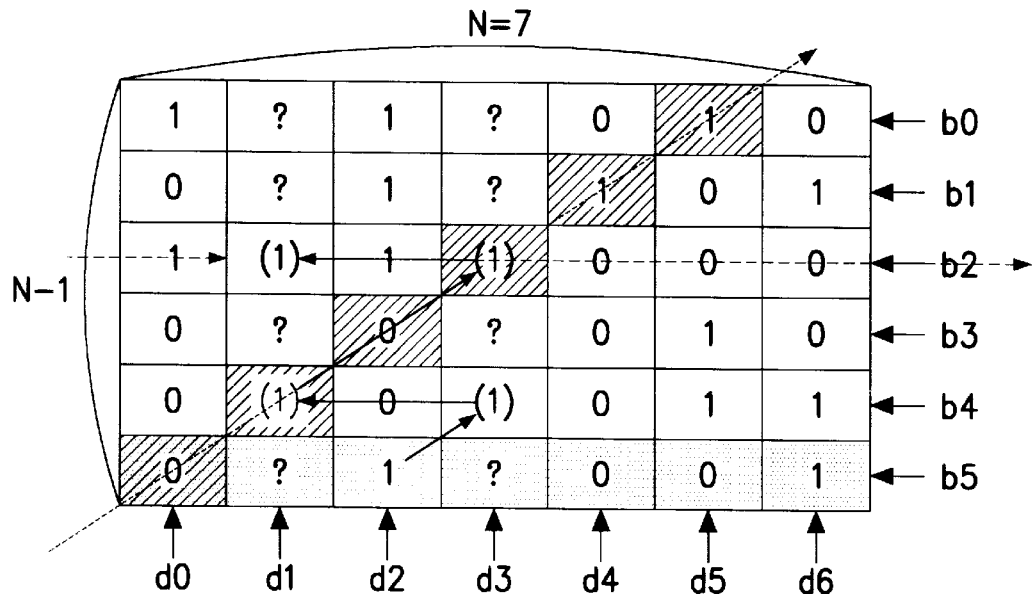

Similarly, if m=1, Formulae 5 and 6 may be respectively expressed as follows:

$a_{(2,3)}=a_{(5,0)} \oplus a_{(4,1)} \oplus a_{(3,2)} \oplus a_{(1,4)} \oplus a_{(0,5)}=0 \oplus 1 \oplus 0 \oplus 1 \oplus 1=1$ $a_{(2,1)}=a_{(2,0)} \oplus a_{(2,2)} \oplus a_{(2,3)} \oplus a_{(2,4)} \oplus a_{(2,5)} \oplus a_{(2,6)}=$
    $1 \oplus 1 \oplus 1 \oplus 0 \oplus 0 \oplus 0=1$ These decoded values "1" and "1" obtained by alternate application of the diagonal and horizontal parity groups are shown in FIG. 20C.

Figure 20D:
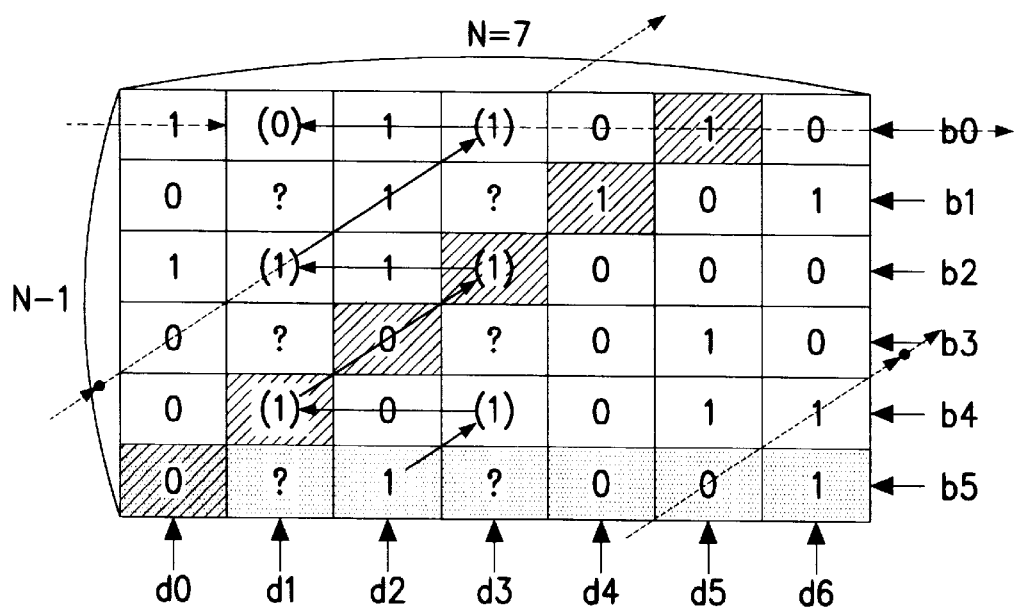

Similarly, if m=2, Formulae 5 and 6 may be respectively expressed as follows:

$a_{(0,3)}=a_{(5,5)} \oplus a_{(4,6)} \oplus a_{(3,0)} \oplus a_{(2,1)} \oplus a_{(1,2)}=0 \oplus 1 \oplus 0 \oplus 1 \oplus 1=1$ $a_{(0,1)}=a_{(0,0)} \oplus a_{(0,2)} \oplus a_{(0,3)} \oplus a_{(0,4)} \oplus a_{(0,5)} \oplus a_{(0,6)}=$
    $1 \oplus 1 \oplus 1 \oplus 0 \oplus 1 \oplus 0=0$ These decoded value "1" and "0" obtained by alternate application of the diagonal and horizontal parity groups are shown in FIG. 20D.

Figure 20E:
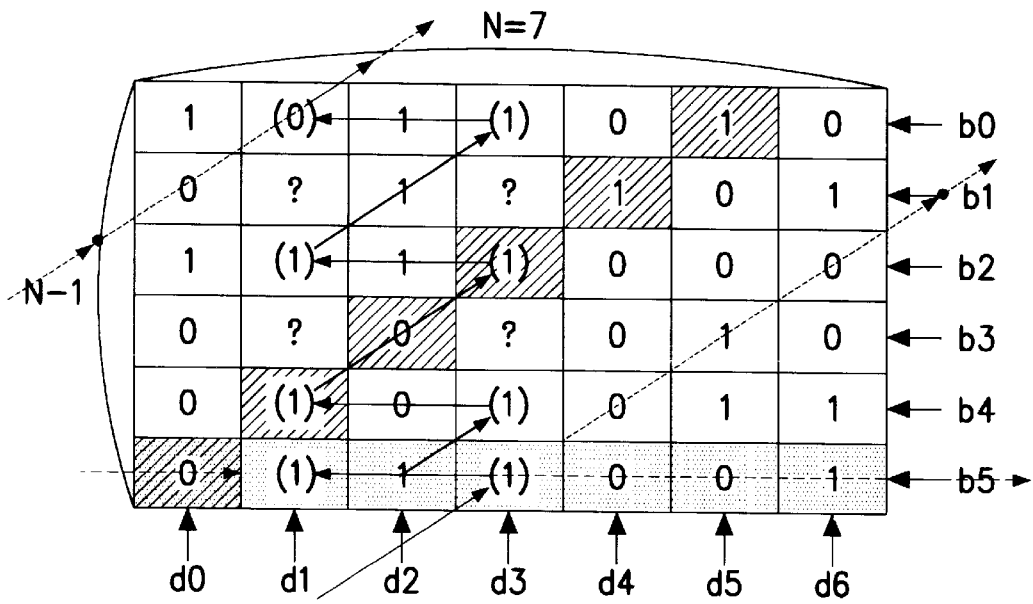

Similarly, if m=3, Formulae 5 and 6 may be respectively expressed as follows:

$a_{(5,3)}=a_{(4,4)} \oplus a_{(3,5)} \oplus a_{(2,6)} \oplus a_{(1,0)} \oplus a_{(0,1)}=0 \oplus 1 \oplus 0 \oplus 0 \oplus 0=1$ $a_{(5,1)}=a_{(5,0)} \oplus a_{(5,2)} \oplus a_{(5,3)} \oplus a_{(5,4)} \oplus a_{(5,5)} \oplus a_{(5,6)}=$
    $0 \oplus 1 \oplus 1 \oplus 0 \oplus 0 \oplus 1=1$ These decoded values "1" and "1" obtained by alternate application of the diagonal and horizontal parity groups are shown in FIG. 20E.

Figure 20F:
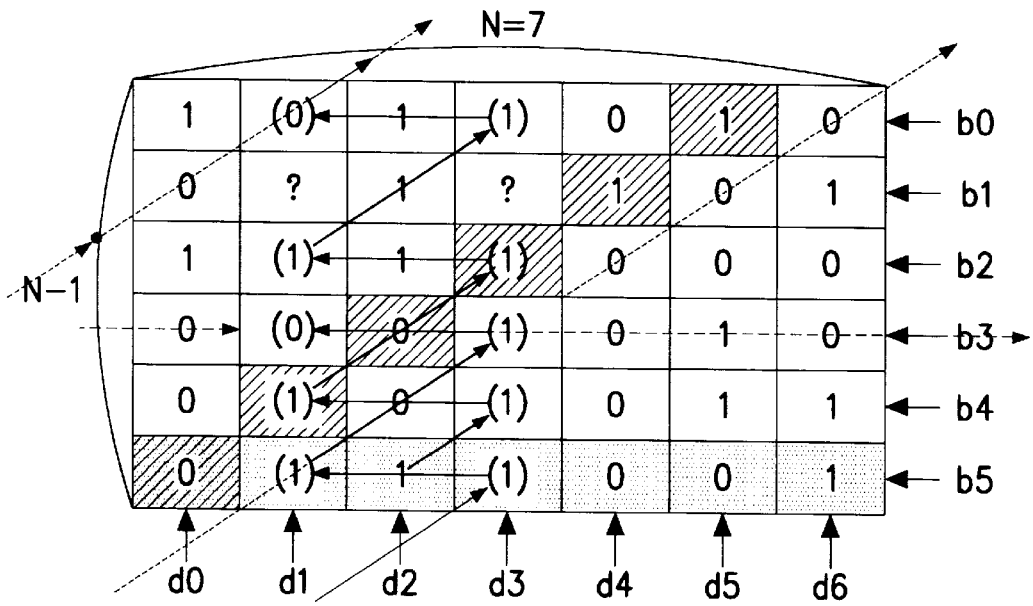

Similary, if m=4, Formulae 5 and 6 may be respectively expressed as follows:

$a_{(3,3)}=a_{(5,1)} \oplus a_{(4,2)} \oplus a_{(2,4)} \oplus a_{(1,5)} \oplus a_{(0,6)}=1 \oplus 0 \oplus 0 \oplus 0 \oplus 0=1$ $a_{(3,1)}=a_{(3,0)} \oplus a_{(3,2)} \oplus a_{(3,3)} \oplus a_{(3,4)} \oplus a_{(3,5)} \oplus a_{(3,6)}=0 \oplus 0$
    $\oplus 1 \oplus 0 \oplus 1 \oplus 0=0$ These decoded values "1" and "0" obtained by alternate application of the diagonal and horizontal parity groups are shown in FIG. 20F.

Figure 20G:
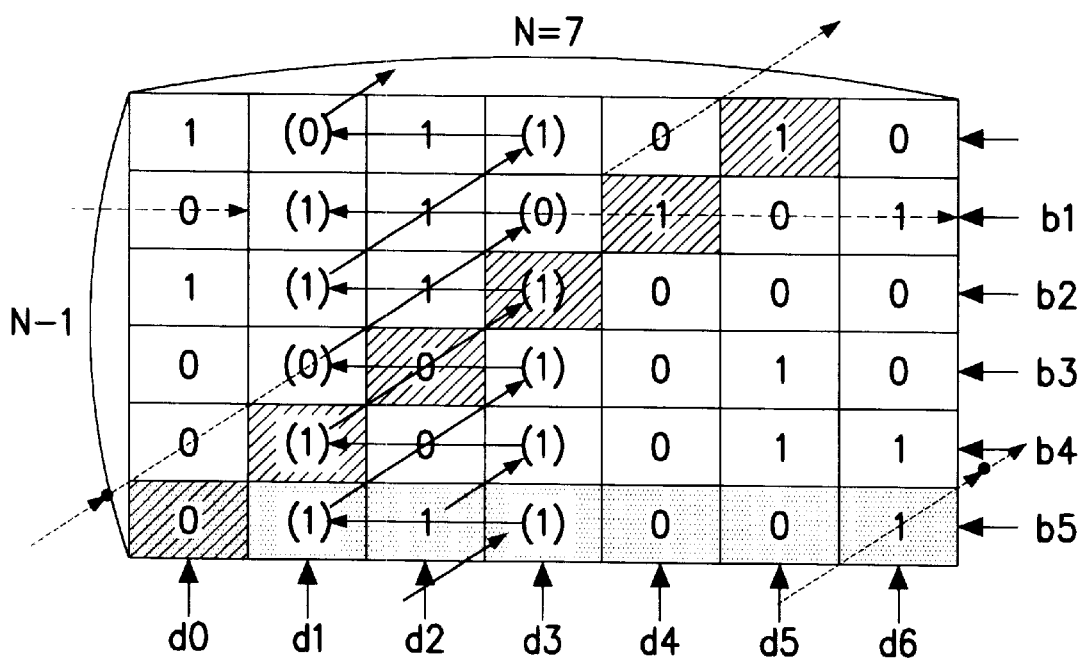

Similarly, if m=5, Formuale 5 and 6 may be respectively expressed as follows:

$a_{(1,3)}=a_{(5,6)} \oplus a_{(4,0)} {}_{61} a_{(3,1)} \oplus a_{(2,2)} \oplus a_{(0,4)}=1 \oplus 0 \oplus 0 \oplus 1 \oplus 0=0$ $a_{(1,1)}=a_{(1,0)} \oplus a_{(1,2)} \oplus a_{(1,3)} \oplus a_{(1,4)} \oplus a_{(1,5)} \oplus a_{(1,6)}=$
    $0 \oplus 1 \oplus 0 \oplus 1 \oplus 0 \oplus 1=1$ These decoded values "0" and "1" obtained by alternate application of the diagonal and horizontal parity groups are shown in FIG. 20G.

Another embodiment will now be described with reference to FIGS. 2, 4, 8 to 10, 15 to 18, 21, and 22A to 22G, where a DH2 parity arrangement is used.

DH2 Parity Arrangement

Figure 2:
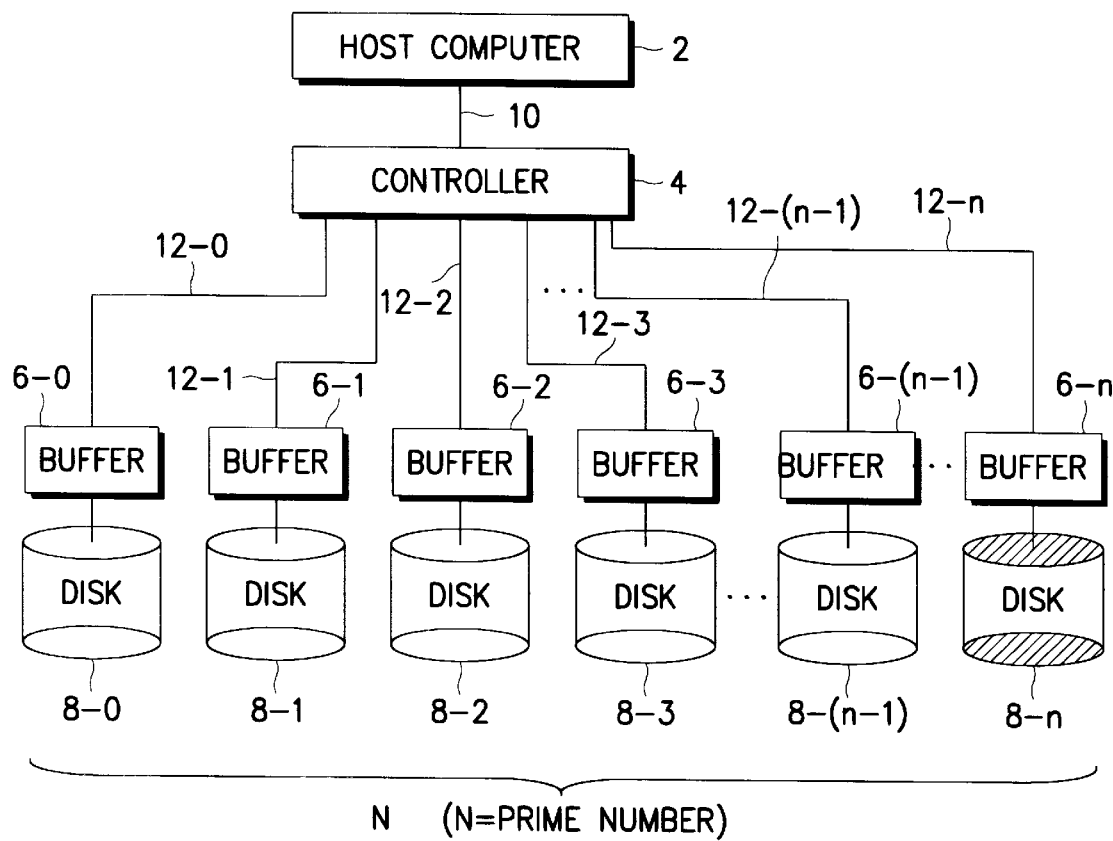
FIG. 2 is a block diagram illustrating the structure of a disk array arranged according to a DH2 (diagonal and horizontal) parity arrangement according to another embodiment of the present invention.

Referring to FIG. 2, an additional disk (N+1) disk) and a corresponding buffer 6−n are added to the structure of FIG. 1. In addition, corresponding to I/O bus 12−n serves as the connection between the controller 4 and buffer 6−n and disk 8−n. The additional disk 8−n is used to reduce the bottle neck overhead occurring when revising the data contents of the disks in the DH parity arrangement, and serves as the horizontal parity disk for storing the horizontal parity blocks. Of course, the diagonal parity blocks are distributed among the other disks as in the DH parity arrangement.

Referring to FIGS. 4 and 8 to 10, a structure of the DH2 parity arrangement (Definition 4), horizontal parity blocks and groups (Definition 5), diagonal parity blocks and groups (Definition 6), and data arrangement according to the definitions are shown. A more detailed description follows.

Definition 4: Structure of DH2 Parity Arrangement

If a disk array consists of N+1 disks where N=prime number, and each of the disks is logically divided into N−1 blocks, then a matrix is defined as an (N−1)*(N+1) matrix. Table 3 shows the elements of the matrix.

TABLE 3

| $a_{(0,0)}$ | $a_{(0,1)}$ | ... | $a_{(0,j)}$ | ... | $a_{(0,N-1)}$ | $a_{(0,N)}$ |
|---|---|---|---|---|---|---|
| $a_{(1,0)}$ | $a_{(1,1)}$ | ... | $a_{(1,j)}$ | ... | $a_{(1,N-1)}$ | $a_{(1,N)}$ |
| $a_{(2,0)}$ | $a_{(2,1)}$ | ... | $a_{(2,j)}$ | ... | $a_{(2,N-1)}$ | $a_{(2,N)}$ |
| ... | | ... | ... | ... | ... | $a_{(3,N)}$ |
| $a_{(1,0)}$ | $a_{(i,1)}$ | ... | $a_{(i,j)}$ | ... | $a_{(i,N-1)}$ | $a_{(4,N)}$ |
| ... | | ... | ... | ... | ... | ... |
| $a_{(N-2,0)}$ | $a_{(N-2,1)}$ | ... | $a_{(N-2,j)}$ | ... | $a_{(N-2,N-1)}$ | $a_{(N-2,N)}$ |

Definition 5: Horizontal Parity Groups and Blocks in the DH2 Parity Arrangement

The data blocks of each row of the matrix $a_{(i,j)}$ defined by Definition 4 as representing a disk array are defined as an error correction group of horizontal parities (hereinafter referred to as a "horizontal parity group"), and the last blocks of the horizontal parity groups, i.e., (N+1) disk are defined as the horizontal parity blocks, each of which respectively stores the value obtained by XOR'ing the remaining blocks of each parity group. Namely, the blocks defined as $a_{(i,N)}$ store their respective horizontal parities, where $i \leq i \leq N-3$.

Figure 4:
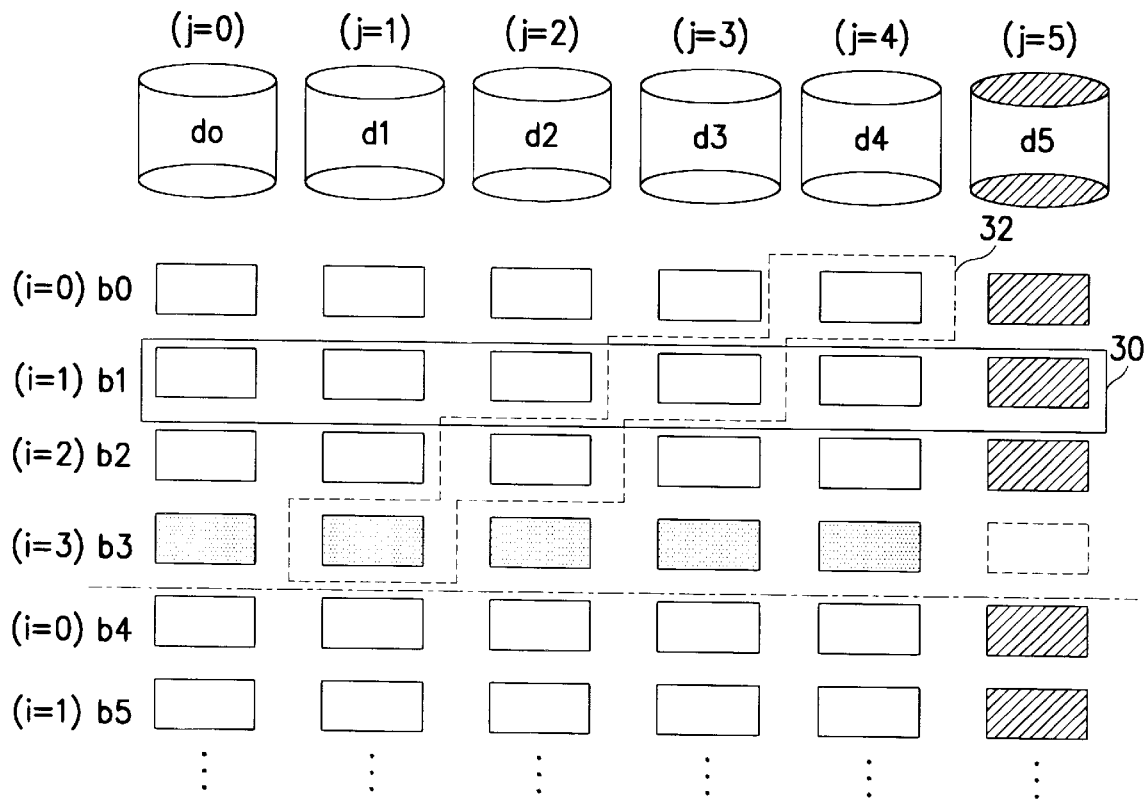
FIG. 4 is a schematic diagram illustrating diagonal and horizontal parity groups together with parity blocks according to the DH2 arrangement of FIG. 2.
Figure 4:
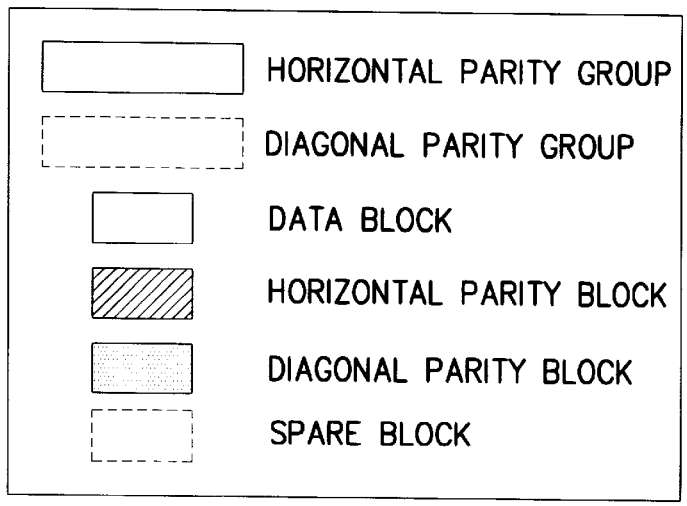
Figure 8:
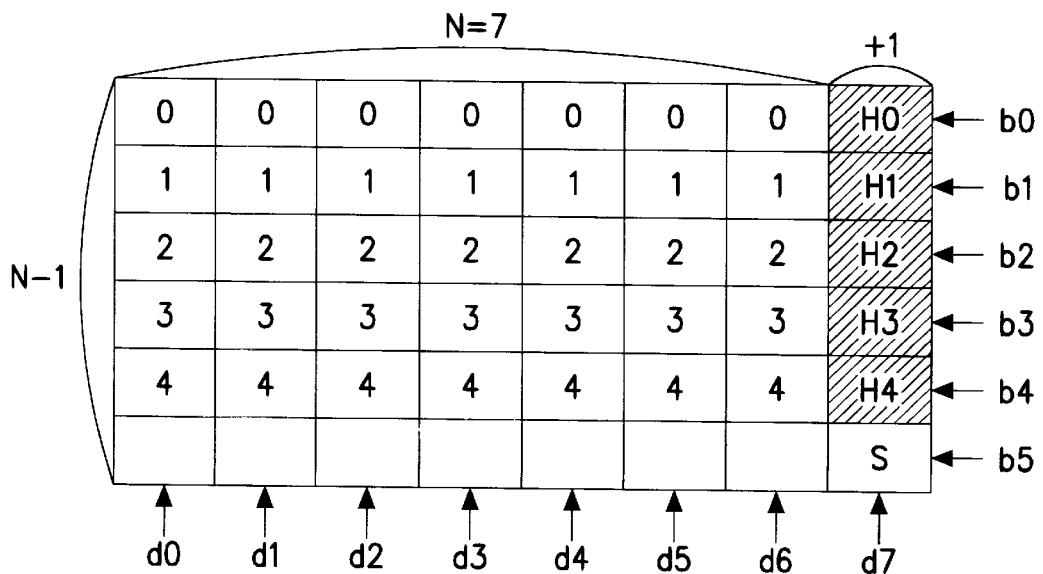
FIG. 8 is a map illustrating an inventive DH2 arrangement of the horizontal parity groups and blocks with the number of disks N=7.

Referring to FIG. 4, a disk array is shown including six disks (N+1=6) d0 to d5, each of which is logically divided into four blocks (N-1=4) b0–b3, b4–b7, ..., b°–b23. Hence, there are formed four horizontal parity groups. The reference numeral 30 represents the horizontal parity group including the second block b1. The hatched blocks of the sixth disk d5 represent the horizontal parity blocks expressed by $a_{(i,N)}$. FIG. 8 shows the horizontal parity group Nos. 0, 1, 2, 3, and 4 of the DH2 parity arrangement in the case of N=7, where the hatched blocks H0 to H4 represent the horizontal parity blocks of the horizontal parity groups.

Definition 6: Diagonal Parity Groups and Blocks in DH2 Parity Arrangement

Figure 9:
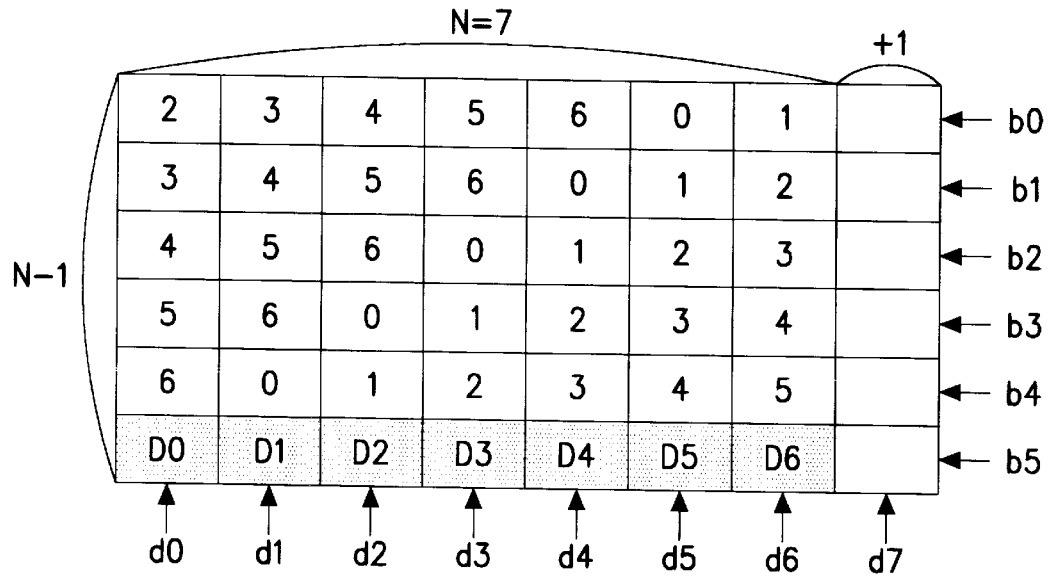
FIG. 9 is a map illustrating the inventive DH2 arrangement of the diagonal parity groups and blocks with the number of disks N=7.

They are defined in the same way as in Definition 3. Referring to FIG. 4, the blocks enclosed in the slotted line indicated by reference numeral 32 represent the second parity group. In addition, the blocks of the fourth row (i=3) marked with dots represent the diagonal parity blocks to respectively store the parity values of the diagonal parity groups. FIG. 9 illustrates the diagonal parity groups with identification numbers in the case of N=7, where the blocks D0 to D6 marked with dots represent the diagonal parity blocks.

Figure 10:
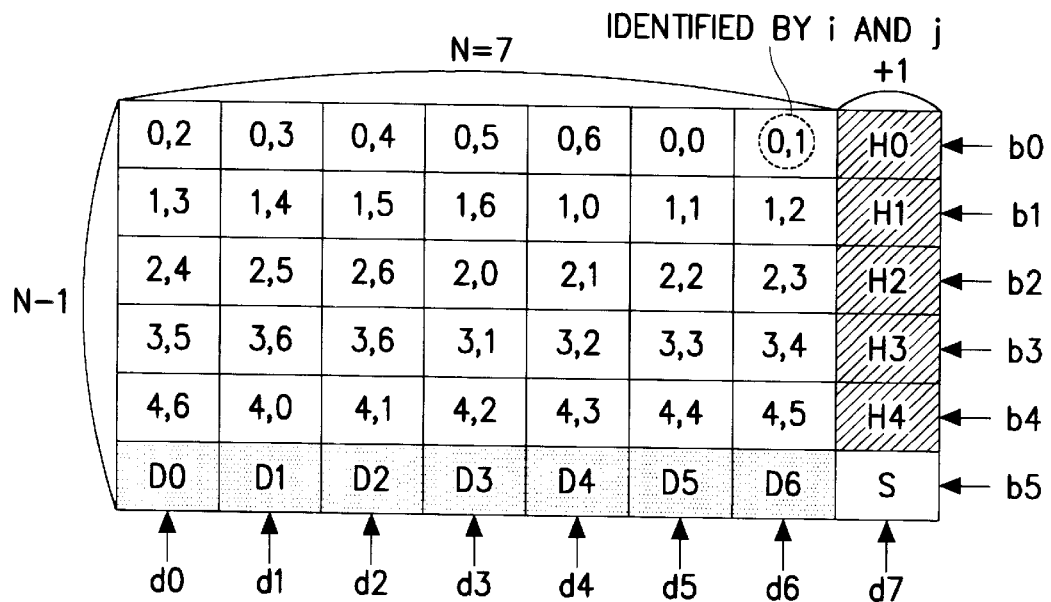
FIG. 10 is a map illustrating the inventive DH2 arrangement of the parity and data with the number of disks N=7.

The blocks, except the horizontal and diagonal parity blocks as defined by Definitions 5 and 6, are data blocks to store actual data. FIG. 10 depicts the arrangement of the parities and data in the form of a matrix in the case of N=7 in the DH2 parity arrangement. Reference numerals H0 to H4 represent the horizontal parity blocks of the horizontal parity group Nos. 0 to 5, and D0 to D6 represent the diagonal parity blocks of the diagonal parity group Nos. 0 to 6. Each of the data blocks is identified by i and j, where i represents the horizontal parity groups and j the diagonal parity groups.

Figure 15:
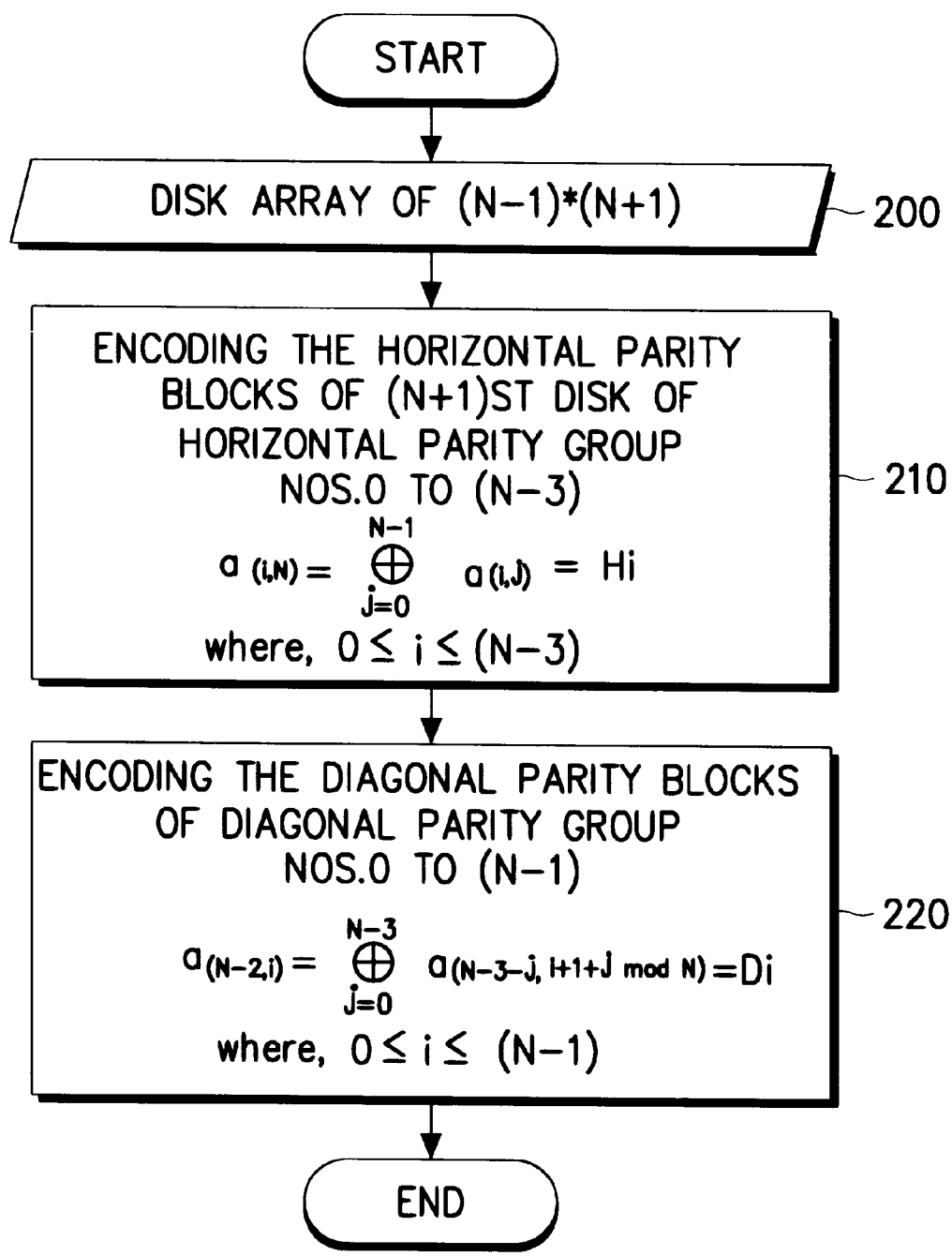
FIG. 15 is a flow chart illustrating the steps of the parity storing algorithm according to an inventive DH2 arrangement.

The parity storage algorithm of the DH2 parity arrangement provides a method for obtaining the parity values of the data blocks of the parity groups by XOR'ing, as shown in FIG. 15. A disk array of (N−1)*(N+1) is controlled by the controller 4 (see FIG. 2) to store the horizontal and diagonal parities respectively through steps 210 and 220. Namely, in step 210, the controller 4 calculates upon the horizontal parities of the horizontal parity group Nos. 0 to (N−3) to encode the horizontal parity blocks with the corresponding horizontal parities. The horizontal parities are calculated by the following Formula 7:

$$a_{(i,N)} = \bigoplus_{j=0}^{N-1} a_{(i,j)} = H_i \quad (7)$$

Where $0 \leq i \leq (N-3)$

Afterwards, in step 220, the controller calculates the diagonal parities of the diagonal parity group Nos. 0 to (N−1) to encode the diagonal parity blocks with the corresponding diagonal parities. The diagonal parities are calculated by the following Formula 8:

$$a_{(N-2,i)} = \bigoplus_{j=0}^{N-3} a_{(N-3-j,i+j \bmod N)} = D_i \quad (8)$$

Where $0 \leq i \leq (N-1)$

The process for calculating the horizontal and diagonal parities by Formulae 7 and 8 is described with reference to FIGS. 16 to 18, where the number of the disks is 8(=N+1).

<Storing Parities according to DH2 Parity Arrangement in the case of N=7>

Table 4 shows a matrix of a disk array comprised of seven disks (N=7), each disk of which has the blocks identified by the corresponding element numbers of the matrix to be used for encoding and decoding in the DH2 parity arrangement.

TABLE 4

| $a_{(0,0)}$ | $a_{(0,1)}$ | $a_{(0,2)}$ | $a_{(0,3)}$ | $a_{(0,4)}$ | $a_{(0,5)}$ | $a_{(0,6)}$ | $a_{(0,7)}$ |
|---|---|---|---|---|---|---|---|
| $a_{(1,0)}$ | $a_{(1,1)}$ | $a_{(1,2)}$ | $a_{(1,3)}$ | $a_{(1,4)}$ | $a_{(1,5)}$ | $a_{(1,6)}$ | $a_{(1,7)}$ |
| $a_{(2,0)}$ | $a_{(2,1)}$ | $a_{(2,2)}$ | $a_{(2,3)}$ | $a_{(2,4)}$ | $a_{(2,5)}$ | $a_{(2,6)}$ | $a_{(2,7)}$ |
| $a_{(3,0)}$ | $a_{(3,1)}$ | $a_{(3,2)}$ | $a_{(3,3)}$ | $a_{(3,4)}$ | $a_{(3,5)}$ | $a_{(3,6)}$ | $a_{(3,7)}$ |
| $a_{(4,0)}$ | $a_{(4,1)}$ | $a_{(4,2)}$ | $a_{(4,3)}$ | $a_{(4,4)}$ | $a_{(4,5)}$ | $a_{(4,6)}$ | $a_{(4,7)}$ |
| $a_{(5,0)}$ | $a_{(5,1)}$ | $a_{(5,2)}$ | $a_{(5,3)}$ | $a_{(5,4)}$ | $a_{(5,5)}$ | $a_{(5,6)}$ | $a_{(5,7)}$ |

Figure 16:
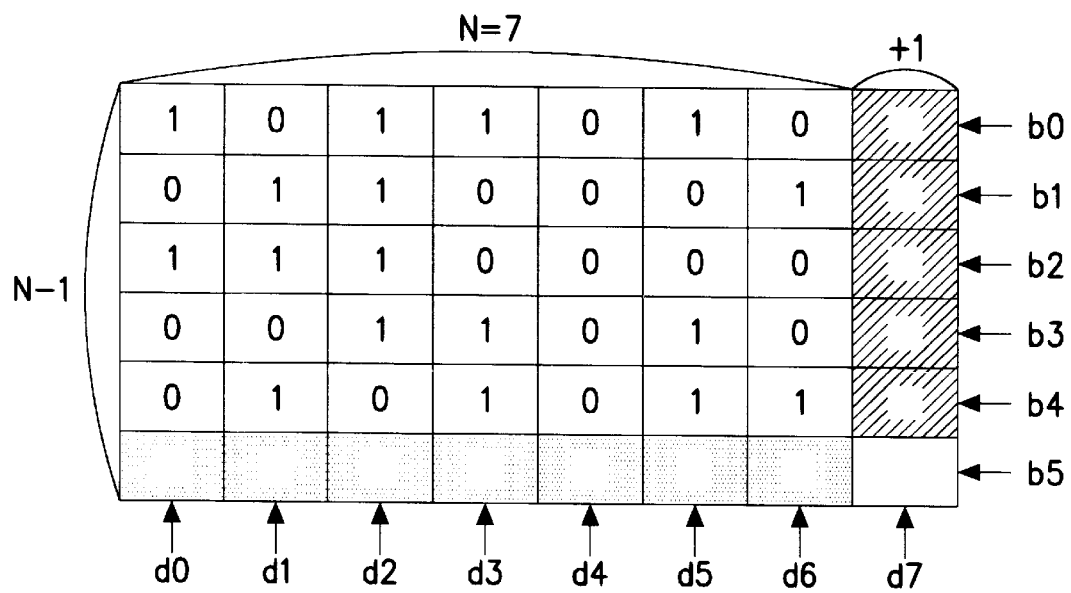
FIGS. 16 to 18 are maps illustrating a process of storing the parities according to the inventive DH2 arrangement with the number of disks N=7.
Figure 17:
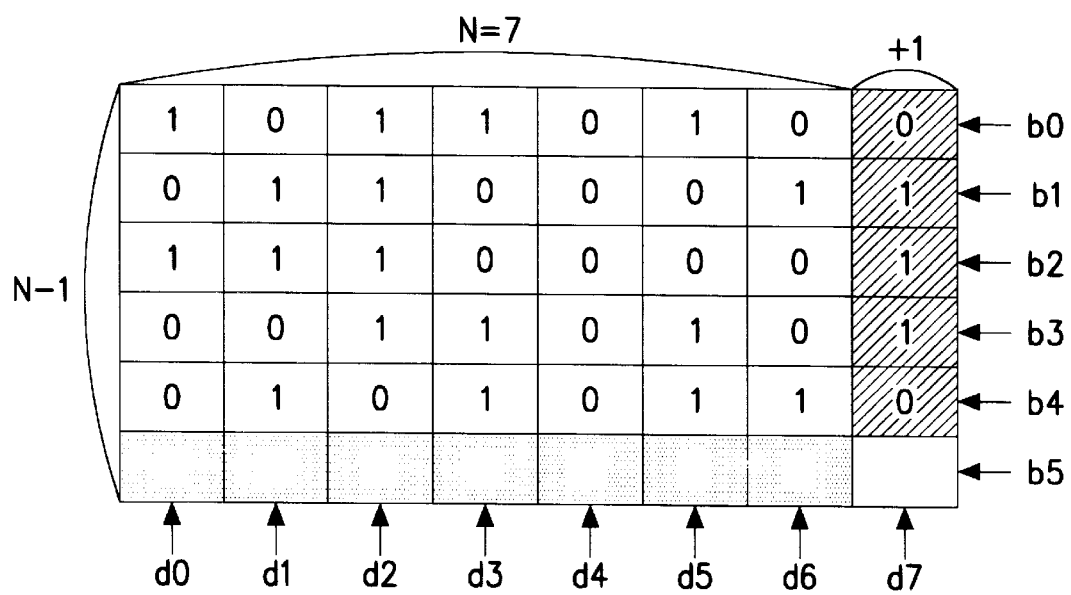

FIG. 16 illustrates the data blocks of the matrix as shown in Table 4, where binary data are stored in the data blocks. After XOR'ing by Formulae 7 and 8, the horizontal parities are stored in the hatched blocks of the last horizontal parity disk and the diagonal parities are stored in the dotted blocks. The horizontal parities of the horizontal parity blocks are obtained by using Formula 7 as follows:

$H0=a_{(0,7)}=a_{(0,0)} \oplus a_{(0,1)} \oplus a_{(0,2)} \oplus a_{(0,3)} \oplus a_{(0,4)} \oplus a_{(0,5)} \oplus a_{(0,6)}=$
$1 \oplus 0 \oplus 1 \oplus 1 \oplus 0 \oplus 1 \oplus 0=0$ $H1=a_{(1,7)}=a_{(1,0)} \oplus a_{(1,1)} \oplus a_{(1,2)} \oplus a_{(1,3)} \oplus a_{(1,4)} \oplus a_{(1,5)} \oplus a_{(1,6)}=$
$0 \oplus 1 \oplus 1 \oplus 0 \oplus 0 \oplus 0 \oplus 1=1$ $H2=a_{(2,7)}=a_{(2,0)} \oplus a_{(2,1)} \oplus a_{(2,2)} \oplus a_{(2,3)} \oplus a_{(2,4)} \oplus a_{(2,5)} \oplus a_{(2,6)}=$
$1 \oplus 1 \oplus 1 \oplus 0 \oplus 0 \oplus 0 \oplus 0=1$ $H3=a_{(3,7)}=a_{(3,0)} \oplus a_{(3,1)} \oplus a_{(3,2)} \oplus a_{(3,3)} \oplus a_{(3,4)} \oplus a_{(3,5)} \oplus a_{(3,6)}=$
$0 \oplus 0 \oplus 1 \oplus 1 \oplus 0 \oplus 1 \oplus 0=1$ $H4=a_{(4,7)}=a_{(4,0)} \oplus a_{(4,1)} \oplus a_{(4,2)} \oplus a_{(4,3)} \oplus a_{(4,4)} \oplus a_{(4,5)} \oplus a_{(4,6)}=$
$0 \oplus 1 \oplus 0 \oplus 1 \oplus 0 \oplus 1 \oplus 1=0$ The horizontal parities thus obtained are stored in their respective horizontal parity blocks $a_{(0,7)}$, $a_{(1,7)}$, $a_{(2,7)}$, $a_{(3,7)}$ and $a_{(4,7)}$ as shown in FIG. 17.

Figure 18:
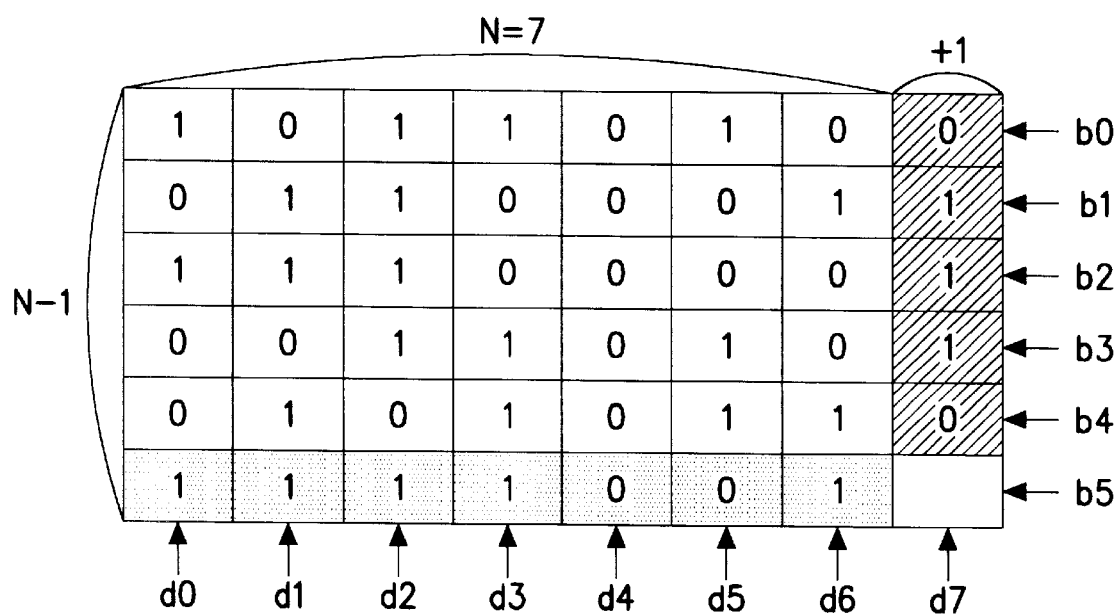

The diagonal parities of the diagonal parity blocks $a_{(5,0)}$, $a_{(5,1)}$, $a_{(5,2)}$, $a_{(5,3)}$, $a_{(5,4)}$, $a_{(5,5)}$ and $a_{(5,6)}$ are obtained by using Formula 8 as follows:

$D0=a_{(5,0)}=a_{(4,1)}\oplus a_{(3,2)}\oplus a_{(2,3)}\oplus a_{(1,4)}\oplus a_{(0,5)}=1\oplus 1\oplus 0\oplus 0\oplus 1=1$ $D1=a_{(5,1)}=a_{(4,2)}\oplus a_{(3,3)}\oplus a_{(2,4)}\oplus a_{(1,5)}\oplus a_{(0,6)}=0\oplus 1\oplus 0\oplus 0\oplus 0=1$ $D2=a_{(5,2)}=a_{(4,3)}\oplus a_{(3,4)}\oplus a_{(2,5)}\oplus a_{(1,6)}\oplus a_{(0,0)}=1\oplus 0\oplus 0\oplus 0\oplus 1\oplus 1=1$ $D3=a_{(5,3)}=a_{(4,4)}\oplus a_{(3,5)}\oplus a_{(2,6)}\oplus a_{(1,0)}\oplus a_{(0,1)}=0\oplus 1\oplus 0\oplus 0\oplus 0=1$ $D4=a_{(5,4)}=a_{(4,5)}\oplus a_{(3,6)}\oplus a_{(2,0)}\oplus a_{(1,1)}\oplus a_{(0,2)}=1\oplus 0\oplus 0\oplus 1\oplus 1\oplus 1=0$ $D5=a_{(5,5)}=a_{(4,6)}\oplus a_{(3,0)}\oplus a_{(2,1)}\oplus a_{(1,2)}\oplus a_{(0,3)}=1\oplus 0\oplus 0\oplus 1\oplus 1\oplus 1=0$ $D6=a_{(5,6)}=a_{(4,0)}\oplus a_{(3,1)}\oplus a_{(2,2)}\oplus a_{(1,3)}\oplus a_{(0,4)}=0\oplus 0\oplus 0\oplus 1\oplus 0\oplus 0=1$ The horizontal and diagonal parities thus obtained are stored in the horizontal and diagonal parity blocks as shown in FIG. 18, where N=7.

With the inventive DH2 parity arrangement, it is possible to rebuild the data contents of a single failed disk by using the horizontal or diagonal parities. The data contents of two failed disks may be rebuilt by alternate application of the horizontal and diagonal parities as in the DH parity arrangement. For example, if one of the horizontal parity groups of a disk array including N+1(N=prime number) disks has an error block, the data of the remaining N blocks are XOR'ed to rebuild the data content of the error block.

Meanwhile, each diagonal parity group includes N−1 blocks distributed among different disks. If there exists two failed disks in the DH2 parity arrangement, the process for rebuilding the data contents of the disks may be considered in two different ways. Namely, if one of the failed disks is the horizontal parity disk including the horizontal parity blocks, the blocks of the other failed disk are firstly rebuilt by means of the diagonal parity groups, and then the horizontal parity disks is rebuilt by means of the algorithm of Formula 7.

If the horizontal parity disk is not included in the failed disks, there exists at least one diagonal parity group including a single error block. Decoding the single error block makes it possible to decode the remaining error block included in the horizontal parity block having the single error block. Subsequently, the remaining error block decoded constitutes a block of another diagonal parity group, so that the remaining error block of the other diagonal parity group may be decoded. In this way, the data contents of the two failed disks of a disk array including N(=prime number) disks may be rebuilt by alternate application of the horizontal and diagonal parities.

Figure 21:
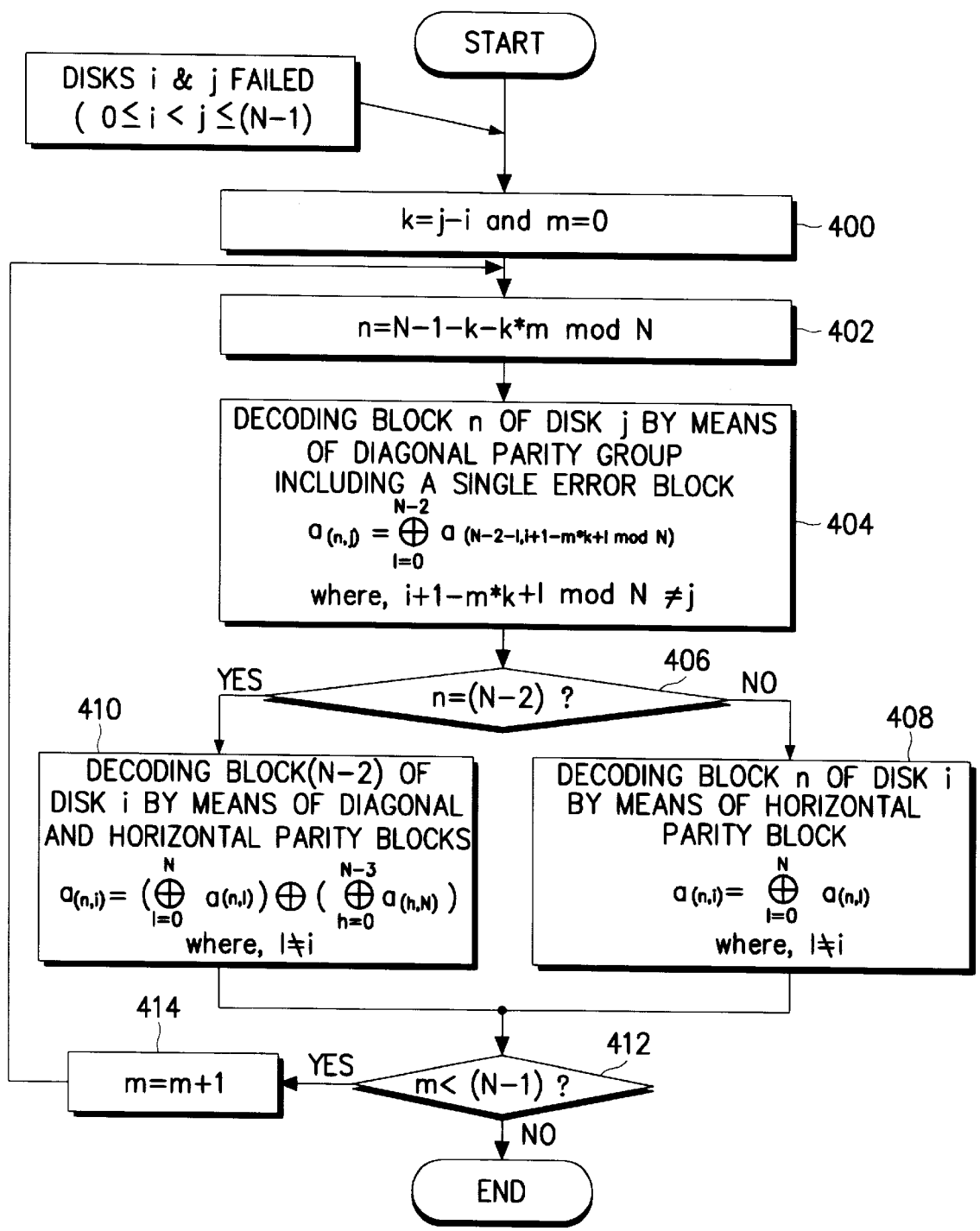
FIG. 21 is a flow chart illustrating the steps of a decoding algorithm with two failed disks according to the inventive DH2 arrangement.

Referring to FIG. 21, a process of decoding two failed disks i and j by alternate application of the diagonal and horizontal parities includes a first step of obtaining a different k between the numbers i and j. The block of the disk j belonging to the diagonal parity group including the diagonal parity block of the disk (i+1) is the decoded. Subsequently decoded is the block of the disk i by means of the horizontal parity group including the decoded block of the disk j. The same decoding steps are repeated under all the blocks of the two failed disks are rebuilt. The algorithm by which the controller 4 as shown in FIG. 2 decodes all the blocks of two failed disks is more specifically described with reference to FIG. 21, where the following assumption is used.

ASSUMPTION

Disks i and j failed ($0 \leq i < j \leq (N-1)$)

The controller 4, in step 400, sets k=j−i and m=0. In other words, the difference between the disks i and j is first obtained, and "m" is initialized to "0" which is a parameter to determine the number of repetitions performed for the decoding steps.

In step 402, the following value "n" is obtained:

$n = N-1-k-m*k \mod N$

As described above concerning the DH parity arrangement, the value "n" represents the error block of the diagonal parity group including a single error block. Then, the controller 4 decodes the error block "n" of the disk j by means of the diagonal parity group in step 404. The value $a_{(n,j)}$ of the error block "n" of the disk j is obtained by Formula 9.

$$a_{(n,j)} = \bigoplus_{j=0}^{N-2} a_{(N-2-l, i+1-m*k+l \mod N)} \qquad (9)$$

Where $i+1-m*k+l \mod N \neq j$

In step 406, the controller 4 decides whether n=N−2. If n is not equal to N−2, step 408 is performed, where the error block "n" of the disk i is decoded by means of the horizontal parity block including the decoded block "n" of the disk j obtained in step 404. The value $a_{(n,i)}$ of the error block "n" of the disk i is obtained by Formula 10.

$$a_{(n,i)} = \bigoplus_{l=0}^{N-1} a_{(n,l)} \qquad (10)$$

$l \neq i$

However, if N=N−2 in step 406, step 410 is performed, where the error block (N−2) of the disk i is decoded by means of the diagonal and horizontal parity blocks. In this case, the value $a_{(n,i)}$ of the error block (N−2) of the disk i is obtained by Formula 11.

$$a_{(n,i)} = \left( \bigoplus_{l=0}^{N-1} a_{(n,l)} \right) \oplus \left( \bigoplus_{h=0}^{N-3} a_{(h,N)} \right) \qquad (11)$$

Where $i \neq 1$

Thereafter, a decision is made in step 412 whether m<(N−1), and if so, "1" is added to "m" (m=m+1) in step 414, and then, the process is returned to the step 402.

Describing more specifically the process of rebuilding the data contents of two failed disks with reference to FIGS. 22A to 22G, the DH2 parity arrangement is similar to that of FIG. 18, and the second disk d1(i=1) and the fourth disk d3(j=3) are failed.

Process of Rebuilding the Data Contents of Two Failed Disks According to the DH2 Parity Arrangement in the Case of N=7

Figure 22A:
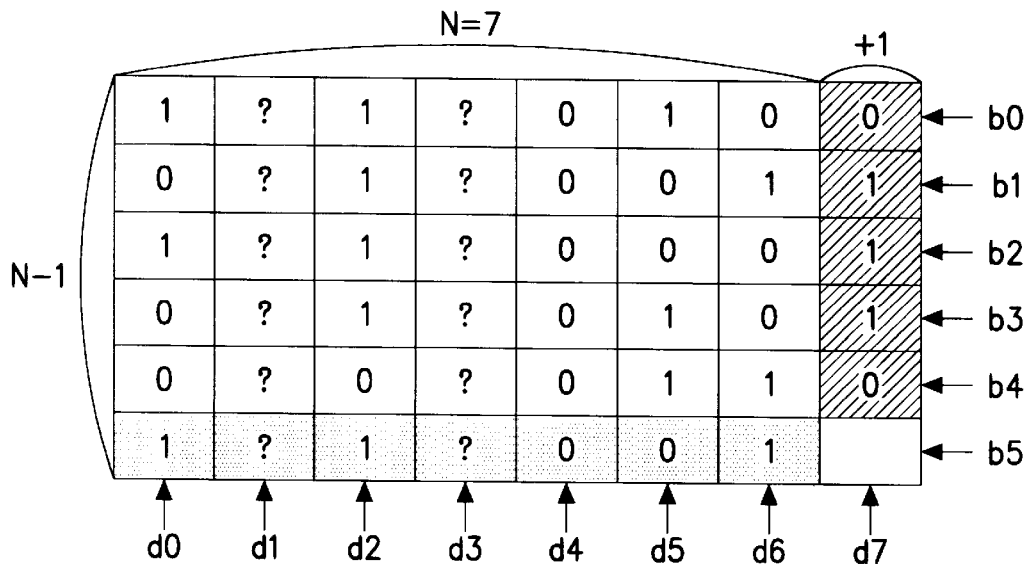
FIGS. 22A to 22G are maps illustrating a process of rebuilding data contents with two failed disks according to the inventive DH2 arrangement.

The matrix of FIG. 22A illustrates the second and fourth disks failed in the disk array of FIG. 18, where i=1, j=3, and therefore, k=2. Hence, n=N−1−k−k*m mod N=7−1−2−2m mod 7=4−2m mod 7. Therefore, Formula 9, to obtain the value of block "n" of the disk j in step 404 of FIG. 21, may be rewritten as Formula 12, and Formula 10, to obtain the value of block "n" of the disk i in step 408 of FIG. 21, may be rewritten as Formula 13.

$$a_{(4-2m \bmod 7, 3)} = \bigoplus_{l=0}^{5} a_{(5-1, 2-2m+1 \bmod 7)} \quad (12)$$

$$a_{(4-2m \bmod 7, 1)} = \bigoplus_{l=0}^{6} a_{(4-2m \bmod 7, l)} \quad (13)$$

However, if n=N−2, Formula 11 of step 410 is expressed as in Formula 14.

$$a_{(N-2, i)} = \left( \bigoplus_{l=0}^{N} a_{(N-2, l)} \right) \oplus \left( \bigoplus_{h=0}^{N-3} a_{(h, N)} \right) \quad (14)$$

Figure 22B:
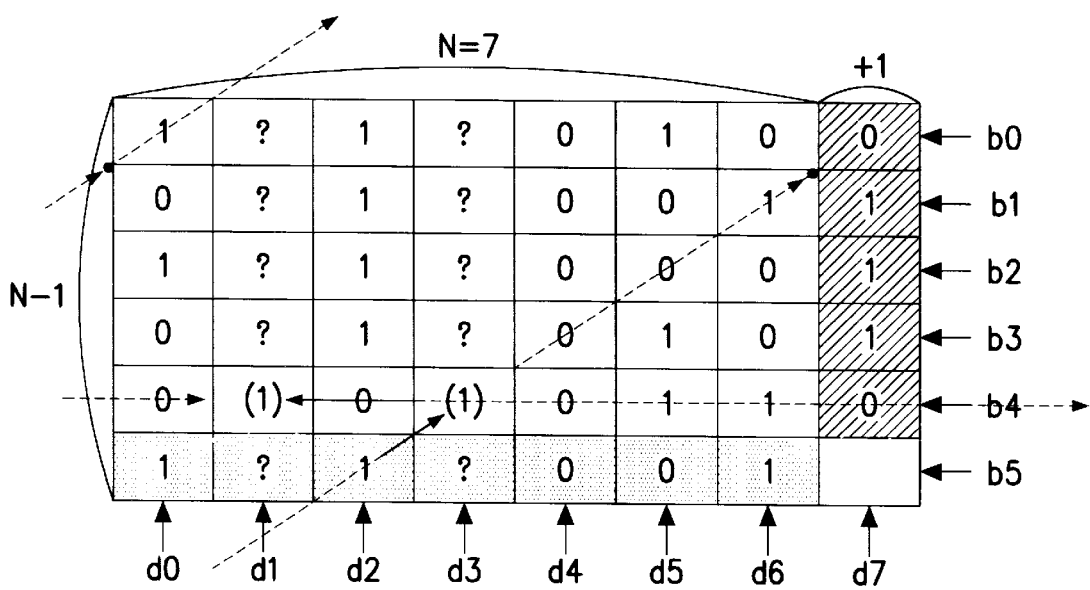

Accordingly, Formulae 12 and 13 may be respectively expressed with m=0 as follows:

$a_{(4,3)}=a_{(5,2)} \oplus a_{(3,4)} \oplus a_{(2,5)} \oplus a_{(1,6)} \oplus a_{(0,0)}=1 \oplus 0 \oplus 0 \oplus 1 \oplus 1=1$ $a_{(4,1)}=a_{(4,0)} \oplus a_{(4,2)} \oplus a_{(4,3)} \oplus a_{(4,4)} \oplus a_{(4,5)} \oplus a_{(4,6)} \oplus a_{(4,7)}=$
$\quad 0 \oplus 0 \oplus 1 \oplus 0 \oplus 1 \oplus 1 \oplus 0=1$ In this case, it will be noted that $a_{(4,3)}$ represents the fifth block (n=4) of the fourth failed disk (j=3), obtaining its value "1" by XOR'ing the remaining blocks of its diagonal parity group. Likewise, $a_{(4,1)}$ represents the fifth block (n=4) of the second failed disk (i=1), obtaining its value "1" by XOR'ing the remaining blocks of its horizontal parity group. These decoded values "1" and "1" obtained by alternate application of the diagonal and horizontal parity groups are shown in FIG. 22B.

Figure 22C:
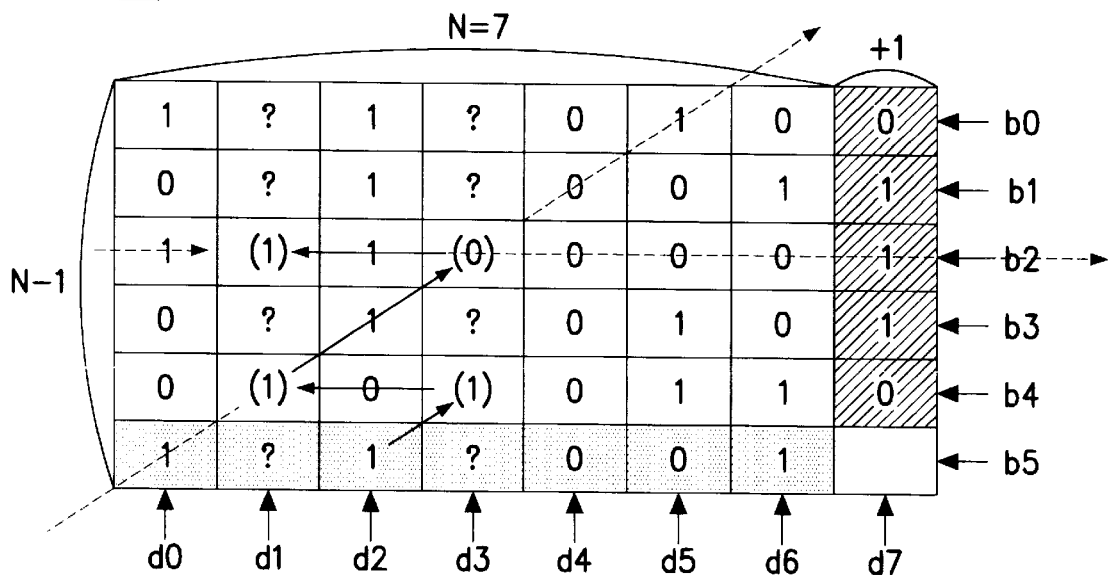

Similarly, if m=1, Formulae 12 and 13 may be respectively expressed as follows:

$a_{(2,3)}=a_{(5,0)} \oplus a_{(4,1)} \oplus a_{(3,2)} \oplus a_{(1,4)} \oplus a_{(0,5)}=1 \oplus 1 \oplus 1 \oplus 0 \oplus 1=0$ $a_{(2,1)}=a_{(2,0)} \oplus a_{(2,2)} \oplus a_{(2,3)} \oplus a_{(2,4)} \oplus a_{(2,5)} \oplus a_{(2,6)} \oplus a_{(2,7)}=$
$\quad 1 \oplus 1 \oplus 0 \oplus 0 \oplus 0 \oplus 0 \oplus 1=1$ These decoded values "0" and "1" obtained by alternate application of the diagonal and horizontal parity groups are shown in FIG. 22C.

Figure 22D:
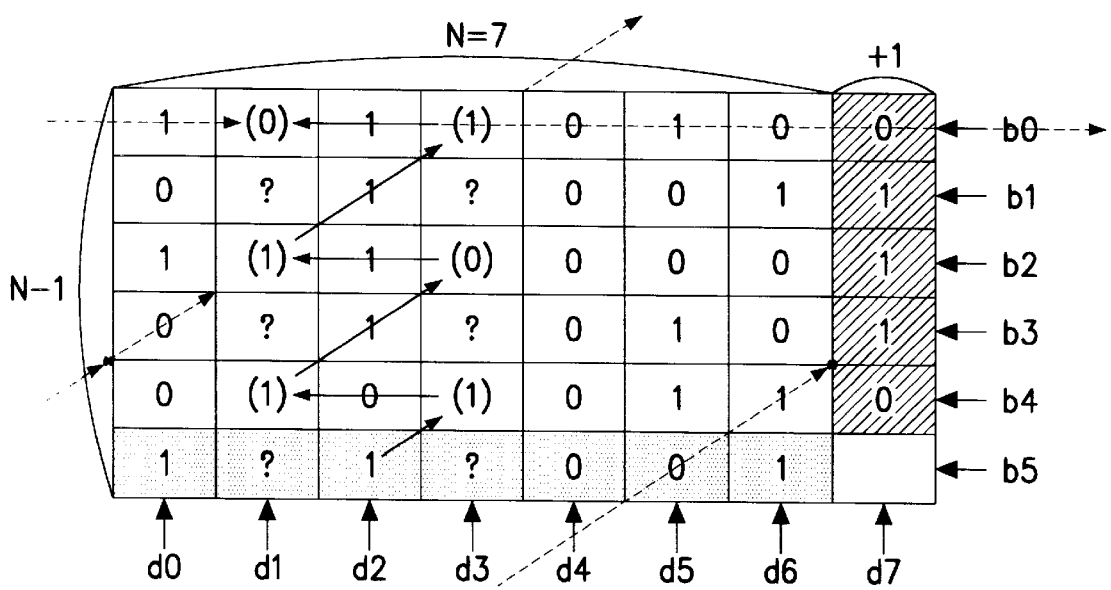

Similarly, if m=2, Formulae 12 and 13 may be respectively expressed as follows:

$a_{(0,3)}=a_{(5,5)} \oplus a_{(4,6)} \oplus a_{(3,0)} \oplus a_{(2,1)} \oplus a_{(1,2)}=0 \oplus 1 \oplus 0 \oplus 1 \oplus 1=1$ $a_{(0,1)}=a_{(0,0)} \oplus a_{(0,2)} \oplus a_{(0,3)} \oplus a_{(0,4)} \oplus a_{(0,5)} \oplus a_{(0,6)} \oplus a_{(0,7)}=$
$\quad 1 \oplus 1 \oplus 1 \oplus 0 \oplus 1 \oplus 0 \oplus 0=0$ These decoded values "1" and "0" obtained by alternate application of the diagonal and horizontal parity groups are shown in FIG. 22D.

Figure 22E:
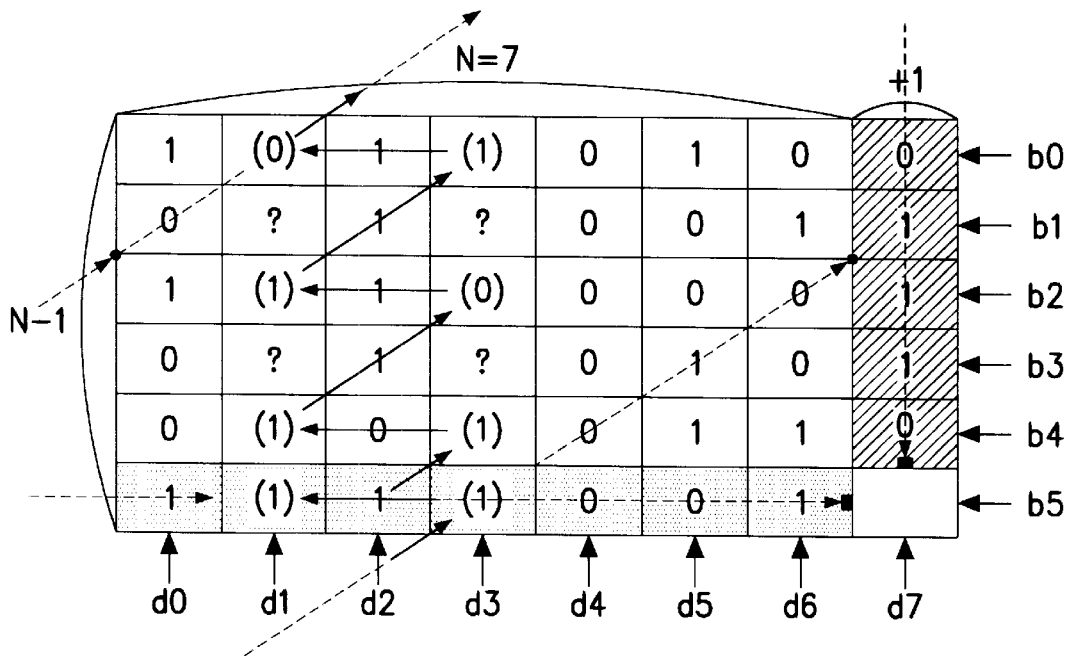

If m=3, n=N−1−k−k*m mod N=7−7−1−2−2*3 mod 7=5=7−2=N−2, and therefore, the failed horizontal parity block $a_{(5,1)}$ is decoded by using Formula 14 in step 410 of FIG. 21. Hence, if m=3, Formulae 12 and 14 may be respectively expressed as follows:

$a_{(5,3)}=a_{(4,4)} \oplus a_{(3,5)} \oplus a_{(2,6)} \oplus a_{(1,0)} \oplus a_{(0,1)}=0 \oplus 1 \oplus 0 \oplus 0 \oplus 0=1$ $a_{(5,1)}=(a_{(5,0)} \oplus a_{(5,2)} \oplus a_{(5,3)} \oplus a_{(5,4)} \oplus a_{(5,5)} \oplus a_{(5,6)}) \oplus (a_{(0,7)} \oplus a_{(1,7)} \oplus a_{(2,7)} \oplus a_{(3,7)} \oplus a_{(4,7)}=$
$\quad (1 \oplus 1 \oplus 1 \oplus 0 \oplus 0 \oplus 1) \oplus (0 \oplus 0 \oplus 1 \oplus 1 \oplus 0)=1$ These decoded values "1" and "1" obtained by alternate application of the diagonal and horizontal parity groups are shown in FIG. 22E.

Figure 22F:
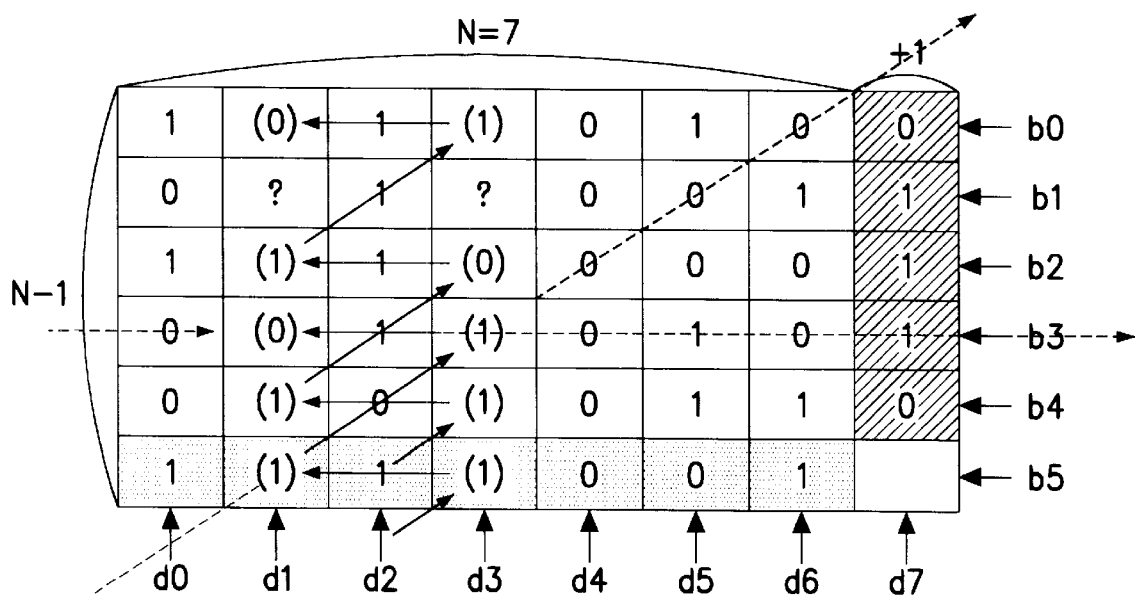

If m=4, Formulae 12 and 13 may be respectively expressed as follows:

$a_{(3,3)}=a_{(5,1)} \oplus a_{(4,2)} \oplus a_{(2,4)} \oplus a_{(1,5)} \oplus a_{(0,6)}=1 \oplus 0 \oplus 0 \oplus 0 \oplus 0=1$ $a_{(3,1)}=a_{(3,0)} \oplus a_{(3,2)} \oplus a_{(3,3)} \oplus a_{(3,4)} \oplus a_{(3,5)} \oplus a_{(3,6)} \oplus a_{(3,7)}=$
$\quad 0 \oplus 1 \oplus 1 \oplus 0 \oplus 1 \oplus 0 \oplus 1=0$ These decoded values "1" and "0" obtained by alternate application of the diagonal and horizontal parity groups are shown in FIG. 22F.

Figure 22G:
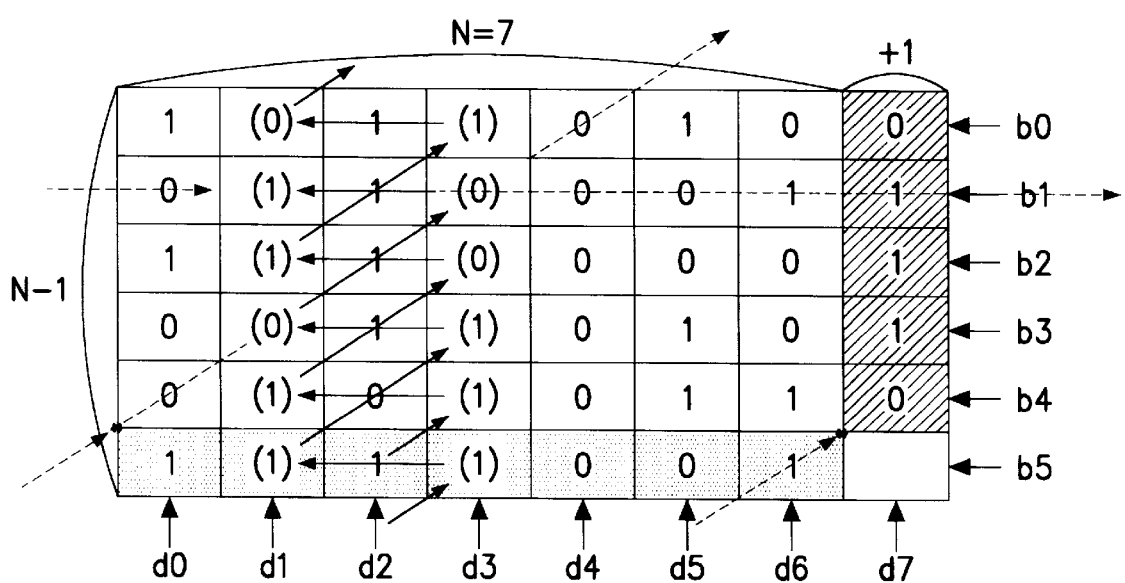

Similarly, if m=5, Formulae 12 and 13 may be respectively expressed as follows:

$a_{(1,3)}=a_{(5,6)} \oplus a_{(4,0)} \oplus a_{(3,1)} \oplus a_{(2,2)} \oplus a_{(0,4)}=1 \oplus 0 \oplus 0 \oplus 1 \oplus 0=0$ $a_{(1,1)}=a_{(1,0)} \oplus a_{(1,2)} \oplus a_{(1,3)} \oplus a_{(1,4)} \oplus a_{(1,5)} \oplus a_{(1,6)} \oplus a_{(1,7)}=$
$\quad 0 \oplus 1 \oplus 0 \oplus 0 \oplus 0 \oplus 1 \oplus 1=1$ These decoded values "0" and "1" obtained by alternate application of the diagonal and horizontal parity groups are shown in FIG. 22G. Thus, the data contents of the two failed disks are completely rebuilt as in FIG. 18.

Figure 23:
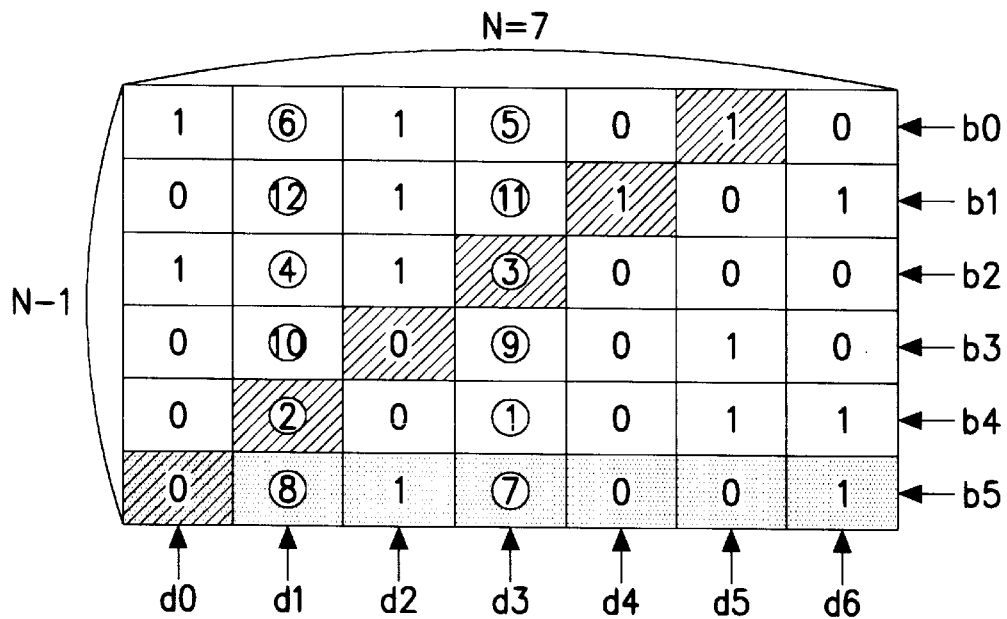
FIG. 23 is a map illustrating parallel correction of data errors according to the present invention.

According to the inventive DH and DH2 parity arrangements, the data contents of the failed disks may be rebuilt in parallel, which makes it possible to decode the error blocks simultaneously in both directions. Such parallel operation is described more specifically with reference to FIG. 23, where the DH parity arrangement is used with N=7. In the previous embodiment, the second (i=1) and fourth (j=3) failed disks are rebuilt in the order indicated by the circled numbers 1→2→3→4→5→6→7→8→9→10→11→12 as shown in FIG. 23. However, this processing order may be reversed. Namely, the diagonal parity group including the sixth block of the fifth disk (j+1) may be used to first decode the second block numbered 12 of the second disk (i=2). Then, the horizontal parity group including the decoded second block numbered 12 is used to decode the block numbered 11. Subsequently, the diagonal parity group including the block numbered 11 is used to decode the block numbered 10. Thus, the data contents of the two failed disks may be rebuilt in the order of 12→11→10→9→8→7→6→5→4→3→2→1, which is the reverse of the case where the diagonal parity groups of the disk (i+1) are first used. Hence, if the decoding process is performed in both directions by using the diagonal parity groups of both disks (i+1) and (j+1), the time taken for rebuilding the failed disks may be reduced to half at maximum.

Hereinafter, the performance evaluation of the inventive DH and DH2 parity arrangements will be compared to those of other parity arrangements (two dimensional parity arrangement, EVENODD parity arrangement). The evaluation indicators are as follows:

(1) The Mean Time To Data Loss (MTTDL),
(2) Parity Disk Overhead,
(3) Update Penalty, and
(4) Group Size.

In the tables and drawings described below, the two dimensional parity arrangement is referred to as 2D and EVENODD as EO.

MTTDL may be expressed by Formula 15 when two failed disks are rebuilt.

$$MTTDL = \frac{MTTF(disk) \times MTTF(disk2) \times MTTF(disk3)}{N \times (G-1) \times (G-2) \times MTTR^2(disk)} \quad (15)$$

Where MTTF(disk) means the mean time to failure, MTTR the mean time to reconstruct, N the total number of disks, and G the size of the error correction group. Although MTTDL is the most important performance evaluation indicator, its actual value is in the order of several tens of thousands, and therefore may hardly affect the performance evaluation. For example, assuming MTTF(disk) is 200,000 hours, MTTF(disk2) 20,000 hours, MTTF(disk3) 2,000 hours, and MTTR 1 hour, and 100 data disks are used in 2D requiring 20 parity disks, then the total number N of the disks is 120 and the group size G is 11. Hence, MTTDL becomes about 85 thousand years. In this case, since MTTF (disk) and MTTR are considered constants, MTTDL is inversely proportional to N and G squared. Hence, MTTDL may be simplified as Formula 16 of $MTTDL_S$, and the inverse thereof $MTTDL_{si}$ as Formula 17.

$$MTTDL_s = \frac{1}{N \times (G-1) \times (G-2)} \quad (16)$$

$$MTTDL_{si} = N \times (G-1) \times (G-2) \quad (17)$$

Figure 24:
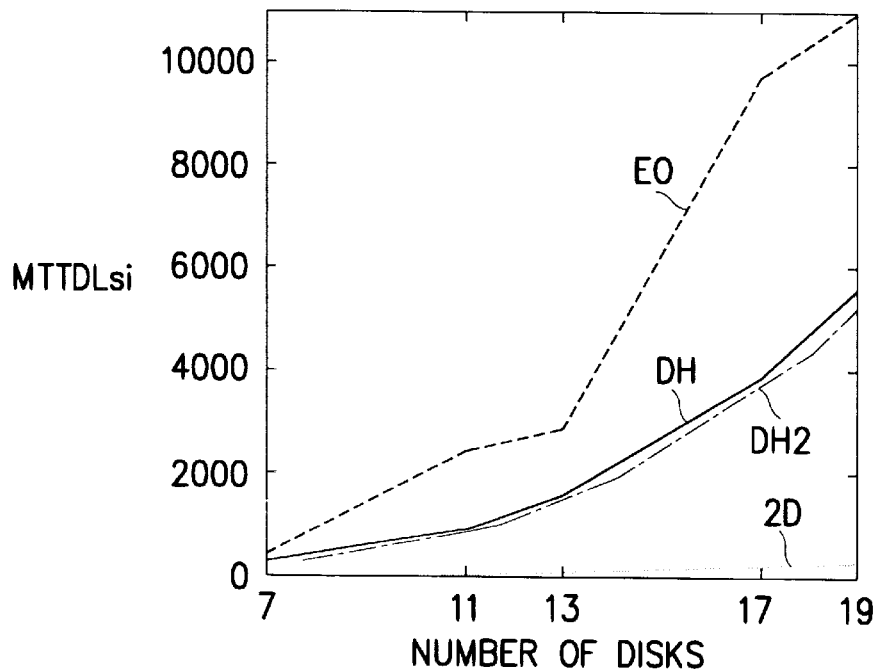
FIG. 24 is a graph illustrating a comparison between MTTDLs of various parity arrangements.

Describing $MTTDL_S$ according to the number of the data disks as shown in Table 5, Table 6 may be obtained. In addition, $MTTDL_{si}$ is graphed in FIG. 24.

TABLE 5

|  | 2D | EO | DH | DH2 |
|---|---|---|---|---|
| No. of Data Disks | m | m | m | m + 1 |
| No. of Parity Disks | $\sqrt{m} + \sqrt{m}$ | 2 | 2 | 2 |
| No. of Total Disks | $m + \sqrt{m} + \sqrt{l}$ | m + 2 | m + 2 | m + 3 |

TABLE 6

|  | 2D | EO |
|---|---|---|
| No. of Data Disks | m | m |
| No. of Total Disks (N) | $m + \sqrt{m} + \sqrt{m}$ | $m + \sqrt{m} + \sqrt{m}$ |
| Size of Error Correction Group (G) | $\sqrt{m} + 1$ | $\sqrt{m} + 1$ |
| $MTTDL_S$ | $\frac{1}{(m + \sqrt{m} + \sqrt{m}) \times (\sqrt{m} + \sqrt{m} -}$ | $\frac{1}{(m+2) \times \left(\frac{3m}{2} - 1\right) \times \left(\frac{3m}{2}\right)}$ |

|  | DH | DH2 |
|---|---|---|
| No. of Data Disks | m | m + 1 |
| No. of Total Disks (N) | m + 2 | m + 3 |
| Size of Error Correction Group (G) | $m + \frac{3m}{2}$ | m + 2 |
| $MTTDL_S$ | $\frac{1}{(m+2) \times \left(m + \frac{1}{2}\right) \times (m -}$ | $\frac{1}{(m+3) \times (m+1) \times m}$ |

The parity disk overhead is the ratio of parity disk number to data disk number as expressed by Formula 18.

$$\text{Parity Disk Overhead} = \frac{\text{No. of Parity Disks}}{\text{No. of Data Disks}} \quad (18)$$

As is evident from Formula 18, the parity disk overhead represents the data storage efficiency of the disks. For example, as the parity disk overhead is reduced, the number of the data disks of a disk array is increased. Hence, the parity disk overhead serves as an indicator to evaluate the ratio of performance to cost. Table 7 shows the parity disk overheads of various parity arrangements in a disk array comprising the same number of disks. In this case, the 2D parity arrangement has the largest parity disk overhead as shown in Table 7. Namely, the parity disk overhead of 2D is about $\sqrt{m}$ times greater than those of the other parity arrangements, and therefore, the data storage efficiency becomes lower compared to the other parity arrangements.

TABLE 7

|  | 2D | EO | DH | DH2 |
|---|---|---|---|---|
| No. of Data Disks | m | m | m | m + 1 |
| No. of Parity Disks | $\sqrt{m} + \sqrt{m}$ | 2 | 2 | 2 |
| Parity Disk Overhead | $\frac{\sqrt{m} + \sqrt{m}}{m}$ | $\frac{2}{m}$ | $\frac{2}{m}$ | $\frac{2}{m+1}$ |

Figure 25:
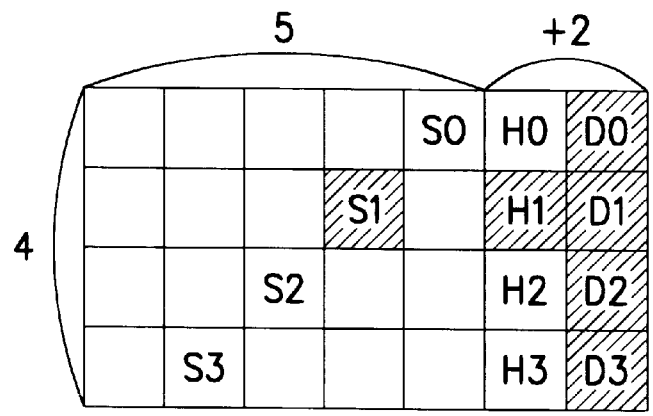
FIG. 25 is a map illustrating parity blocks (when disk number N=7) to be accessed to update diagonal S blocks in an EVENODD arrangement.

Update penalty is defined as the number of the parity disks to access for revising the data content of a data disk. In the parity arrangements for rebuilding the data contents of two failed disks, the optimum update penalty is 2. Large update penalty causes additional parity disks to be accessed for revising the data disk, thus degrading data write performance. 2D and DH2 meet the optimum update penalty, but EO and DH have larger update penalties. For example, EO has update penalty overhead in updating the data blocks existing in a diagonal line S as shown in FIG. 25, because all of the diagonal parity blocks should be updated. Although the number of the parity disks to be accessed to update a data disk of a disk array comprising m disks is 2, the number of the parity blocks to update is m including a horizontal parity block and (m−1) diagonal parity blocks. Hence, the average number of the parity blocks to access is as follows:

$$\frac{(m-1) \times (m + (m-1)^2) \times 2}{m \times (m-1)} = 3 - \frac{2}{m}$$

Figure 26:
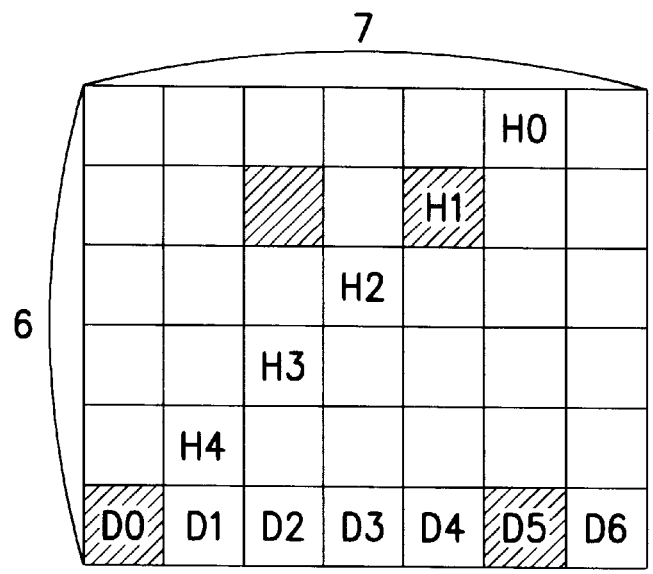
FIG. 26 is a map illustrating parity blocks (when disk number N=7) to be accessed to update data blocks in the inventive DH arrangement.

The update penalty of DH is 3 in updating all the data blocks, because the horizontal and diagonal parity blocks should be updated and the parities of the parity blocks should be maintained. FIG. 26 shows the parity blocks to be updated in updating the hatched data block. As shown in Table 8, 2D and DH2 give optimum update penalty, but EO has update penalty overhead α.

TABLE 8

|  | 2D | EO | DH | DH2 |
|---|---|---|---|---|
| Update Penalty | 2 | 2 + α | 3 | 2 |

Finally, the group size is the size of the error correcting group, and defined as the number of the disks to access in rebuilding the data contents of a failed disk. It is important because the time taken for the rebuilding is linearly extended with the number of disks to be read again. It is preferable to have a small group size, since I/O requirements must be kept, and MTTDL is inversely proportional to group size. The parity arrangements of RAID level 6 have two group sizes because a data block requires two parity blocks. For example, 2D has horizontal and vertical parities, and EO, DH and DH2 have error correction groups of horizontal and diagonal parities. Representing group size G of the various parity arrangements, the names of the parity arrangements are indicated as a superscript of G, and the parity groups as a subscript of G. G without a subscript means take the average of two group sizes.

Figure 27:
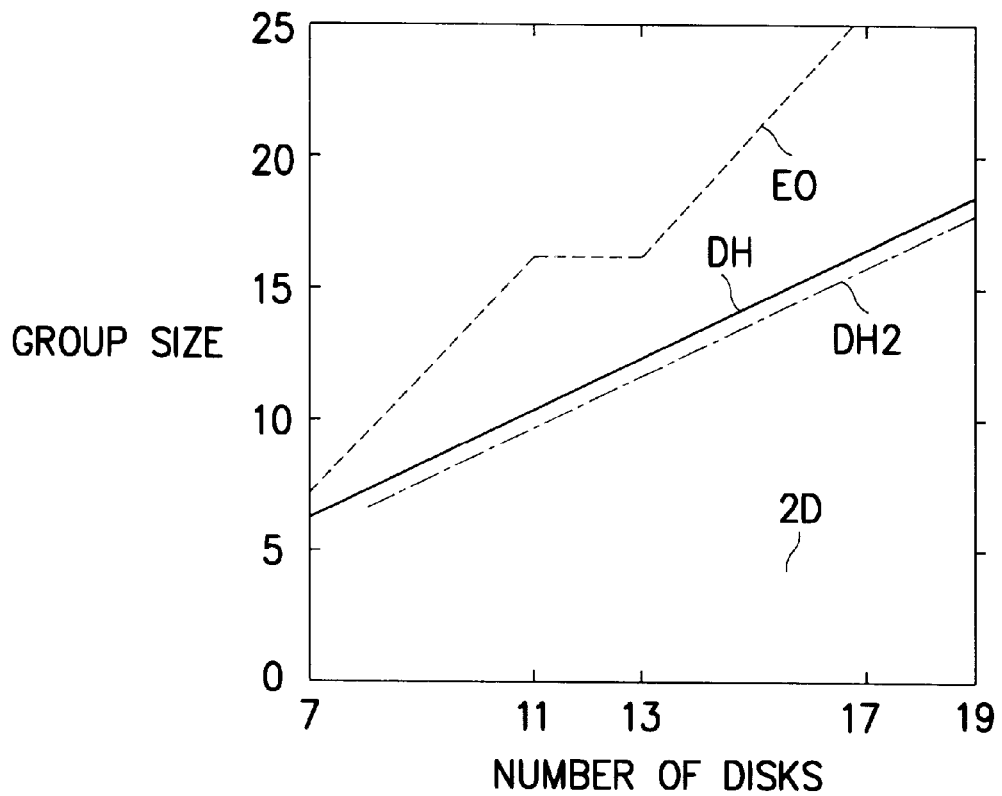
FIG. 27 is a graph illustrating a comparison of group sizes of various parity arrangements.

Considering the group size of 2D with m data disks, the horizontal and vertical group sizes $G_H^{2D}$ and $G_V^{2D}$ are $<\sqrt{m}>+1$ or $[\sqrt{m}]+1$, and the average $G^{2D}$ becomes as follows:

$$G^{2D} = \frac{(\langle\sqrt{m}\rangle+1)\times[\sqrt{m}]+([\sqrt{m}]+1)\times\langle\sqrt{m}\rangle}{[\sqrt{m}]\times\langle\sqrt{m}\rangle} = 1 + \frac{2[\sqrt{m}]\times\langle\sqrt{m}\rangle}{[\sqrt{m}]+\langle\sqrt{m}\rangle}$$

Where [X] is an integer less than or equal to X, and <X> is an integer greater than or equal to X. In EO, the horizontal group size $G_H^{EO}=m+1$, diagonal group size $G_D^{EO}=2(m-1)+1$, and average $G^{EO}=\{(m+1)+(2m-1)\}/2$. In DH, $G_H^{DH}=(m+2)$, $G_D^{DH}=(m+1)$, and $G^{DH}=\{(m+2)\times(m+1)+(m+1)\times(m+2)\}/\{(m+1)+(m+2)\}$. In DH2, $G_H^{DH=(m+2)}$, $G_D^{DH}=(m+1)$, and $G^{DH=\{(m+3)\times(m)+(m+1)\times(m+2)\}/\{(m)+(m+2)\}}$. These are listed in Table 9, and graphed in FIG. 27, where the group size of 2D is the smallest and that of EO the largest due to the overhead of diagonal value S.

TABLE 9

|  | 2D | EO | DH | DH2 |
|---|---|---|---|---|
| No. of Data Disks | m | m | m | m + 1 |
| GS Average | $1 + \dfrac{2\sqrt{m\sqrt{m}}}{\sqrt{m+\sqrt{m}}}$ | $\dfrac{3m}{2}$ | $\dfrac{m^2+3m+2}{2m+3}$ | $(m+2)+\dfrac{m}{2m}$ |

Conclusively, the inventive DH parity arrangement makes it possible to rebuild the data contents of two failed disks of a disk array by alternate application of the diagonal and horizontal parities, and distributes the parity blocks among disks so as to resolve the bottle neck problem. Moreover, the process of rebuilding the data contents of two failed disks may be performed in parallel in both directions so as to reduce the rebuilding time. As shown in FIG. 1, the inventive disk array system includes a plurality of buffers 6-0 to 6-(n-1) corresponding to a plurality of disks 8-0 to 8-(n-1), the buffers are used for caching. This makes it possible to cache recent updated parities so as to reduce the number of times for accessing parity disks in small write from 3 to 2.

The DH2 parity arrangement is similar to DH, but provides an additional parity disk to constitute the horizontal parity blocks, so that it resolves the problem of DH (that an additional access to the parity disks is required to update data disks), thus reducing the update penalty to 2. In addition, the spare blocks present in the horizontal parity disk may be applied to resolve the small write problem.

While the present invention has been described with reference to specific embodiments and accompanying drawings, it will be apparent to those skilled in the art that various modifications and changes may be made without departing from the spirit and scope of the invention as recited in the appended claims.

What is claimed is:

1. A method for storing parity and rebuilding the data contents of two failed disks in an external storage subsystem, comprising the steps of:

providing a disk array defined as a matrix of (N−1)*N including N disks each logically divided into N−1 data blocks where N is a prime number, the data blocks of a row being defined as a horizontal parity group, the data blocks being in a rightwardly and upwardly continuous diagonal line being defined as a diagonal parity group;

defining the data blocks in the diagonal line leftwardly and downwardly from the first data block of the (N−1) disk to the last data block of the first disk as horizontal parity blocks;

defining the data blocks existing in the (N−1) row of said matrix as diagonal parity blocks;

exclusive OR'ing (XORing) the contents of each of said horizontal and diagonal parity groups to obtain the parity value stored in the parity block of the corresponding horizontal or diagonal parity group; and analyzing a diagonal parity group including an error data block of said two failed disks to restore said error data block and then, the horizontal parity group including said restored error data block to restore another error data block, wherein the last analyzing step is repeated to completely rebuild the data contents of said two failed disks.

2. A method as defined in claim 1, further including the step of analyzing the remaining data blocks of said horizontal parity groups to restore error data blocks of a single failed disk.

3. A method as defined in claim 1, wherein said horizontal parity blocks are expressed by $a_{(i,N-2-i)}$ if said matrix of (N−1)*N is expressed by $a_{(i,j)}$ representing logical block i of disk j where $0 \leq i \leq N-2$ and $0 \leq j \leq N-1$.

4. A method as defined in claim 3, wherein said diagonal parity blocks are expressed by $a_{(N-2,j)}$.

5. A method as defined in claim 4, wherein said horizontal parity blocks $a_{(j,N-2-i)}$ store the horizontal parity values obtained by exclusive OR'ing (XORing) the following:

$$a_{(i,N-2-i)} = \bigoplus_{j=0}^{N-1} a_{(i,j)}$$

Where $0 \leq i \leq (N-3)$ or $j\, N-2-i$.

6. A method as defined in claim 4, wherein said diagonal parity blocks $a_{(N-2,j)}$ store the diagonal parity values obtained by XORing the following:

$$a_{(N-2,i)} = \bigoplus_{j=0}^{N-3} a_{(N-3-j,i+1+j\bmod N)}$$

Where $0 \leq i \leq (N-1)$.

7. A method as defined in claim 4, wherein error data blocks $a_{(n,j)}$ of disk j are restored according to the following if errors occur in disks i and j where $0 \leq i < j \leq (N-1)$:

$$a_{(n,j)} = \bigoplus_{l=0}^{N-2} a_{(N-2-l,i+1-m*k+l\bmod N)}$$

Where i+1−m*k+1 mod N j, n=N−1−k−m*k mod N, k=j−i, and m is from 0 to N−2.

8. A method as defined in claim 4, wherein error data blocks a$_{(n,i)}$ of disk i are restored according to the following if errors occur in disks i and j where 0≦i<j≦(N−1):

$$a_{(n,i)} = \bigoplus_{l=0}^{N-1} a_{(n,l)}$$

Where 1 i, n=N−1−k−m*k mod N, k=j−i, and m is from 0 to N−2.

9. A method for storing parity and rebuilding the data contents of two failed disks in an external storage subsystem, comprising the steps of:
   providing a disk array defined as a matrix of (N−1)*(N+1) including N+1 disks each logically divided into N−1 data blocks where N is a prime number, the data blocks of a row being defined as a horizontal parity group, the data blocks except the data blocks of the last (N+1) disk being in a rightwardly and upwardly continuous diagonal line being defined as a diagonal parity group;
   defining the data blocks of the last disk as horizontal parity blocks;
   defining the data blocks existing in the (N−1) row of said matrix as diagonal parity blocks;
   XORing the contents of each of said horizontal and diagonal parity groups to obtain the parity value stored into the parity block of the corresponding horizontal or diagonal parity group; and
   analyzing a diagonal parity group including an error data block of said two failed disks to restore said error data block and then, the horizontal parity group including said restored error data block to restore another error data block, wherein the last analyzing step is repeated to completely rebuild the data contents of said two failed disks.

10. A method as defined in claim 9, further including the step of analyzing the remaining data blocks of said horizontal parity groups to restore error data blocks of a single failed disk.

11. A method as defined in claim 9, wherein said horizontal parity blocks are expressed by a$_{(i,N)}$ if said matrix of (N−1)*(N+1) is expressed by a$_{(i,j)}$ representing logical block i of disk j where 0≦i≦N−2 and 0≦j≦N.

12. A method as defined in claim 11, wherein said diagonal parity blocks are expressed by a$_{(N-2,j)}$.

13. A method as defined in claim 11, wherein said horizontal parity blocks a$_{(i,N)}$ store the horizontal parity values obtained by XORing the following:

$$a_{(i,N)} = \bigoplus_{j=0}^{N-1} a_{(i,j)} = H_i$$

Where $0 \leq i \leq (N-3)$.

14. A method as defined in claim 11, wherein said diagonal parity blocks a$_{(N-2,j)}$ store the diagonal parity values obtained by XORing the following:

$$a_{(N-2,i)} = \bigoplus_{j=0}^{N-3} a_{(N-3-j,i+1+j\bmod N)} = D_i$$

Where $0 \leq i \leq (N-1)$.

15. A method as defined in claim 11, wherein error data blocks a$_{(n,j)}$ of disk j are restored according to the following if errors occur in disks i and j where 0≦i≦j≦(N−1):

$$a_{(n,j)} = \bigoplus_{l=0}^{N-2} a_{(N-2-l,i+1-m*k+l\bmod N)}$$

Where i+1−m*k+1 mod N j, n=N−1−k−m*k mod N, k=j−i, and m is from 0 to N−2.

16. A method as defined in claim 11, wherein error data blocks a$_{(n,i)}$ of disk i are restored according to the following (in case of n=N−2) if errors occur in disks i and j where 0≦i<j≦(N−1):

$$a_{(n,i)} = \bigoplus_{l=0}^{N-1} a_{(n,l)}$$

Where 1 i, n=N−1−k−m*k mod N N−2, k=j−i, and m is from 0 to N−2, and $$a(n, i) = \left(\bigoplus_{l=0}^{N} a(n, l)\right) \oplus \left(\bigoplus_{h=0}^{N-3} a(n, N)\right)$$

Where 1 i, n=N−1−k−m*k mod N=N−2, k=j−i, and m is from 0 to N=2.

17. An apparatus for storing parity and rebuilding the data contents of two failed disks in an external storage subsystem, comprising:
   a disk array defined as a matrix of (N−1)*N including N disks each logically divided into N−1 data blocks where N is a prime number, the data blocks of a row being defined as a horizontal parity group, the data blocks in a rightwardly and upwardly continuous diagonal line being defined as a diagonal parity group, the data blocks existing in the diagonal line leftwardly and downwardly from the first data block of the (N−1) disk to the last data block of the first disk being defined as horizontal parity blocks, the data blocks existing in the (N−1) row of said matrix being defined as diagonal parity blocks; and
   a controller for XORing the contents of each of said horizontal and diagonal parity groups to obtain the parity value stored into the parity block of the corresponding horizontal or diagonal parity group, and analyzing a diagonal parity group including one of error data blocks of said two failed disks to restore said one error data block and then, the horizontal parity group including the restored one error data block to restore another error data block, wherein said analyzing is repeated to completely rebuild the data contents of said two failed disks.

18. An apparatus as defined in claim 17, wherein said controller analyzes the remaining data blocks of said horizontal parity groups to restore error data blocks of a single failed disk.

19. An apparatus as defined in claim 17, further comprising a plurality of buffers connected between said controller and disks for buffering and caching data from said disks, thereby reducing the number of times which said controller accesses said disks for revising data contents.

20. An apparatus for storing parity and rebuilding the data contents of two failed disks in an external storage subsystem, comprising:

a disk array defined as a matrix of (N−1)*(N+1) including N+1 disks each logically divided into N−1 data blocks where N is a prime number, the data blocks of a row being defined as a horizontal parity group, the data blocks except the data blocks of the last (N+1) disk existing in a rightwardly and upwardly continuous diagonal line being defined as a diagonal parity group, the data blocks of the last disk being defined as horizontal parity blocks, the data blocks existing in the (N−1) row of said matrix being defined as diagonal parity blocks; and a controller for XORing the contents of each of said horizontal and diagonal parity groups to obtain the parity value stored into the parity block of the corresponding horizontal or diagonal parity group, and analyzing a diagonal parity group including an error data block of said two failed disks to restore said error data block and then, the horizontal parity group including said restored error data block to restore another error data block, wherein said analyzing is repeated to completely rebuild the data contents of said two failed disks.

21. An apparatus as defined in claim 20, wherein said controller analyzes the remaining data blocks of said horizontal parity groups to restore error data blocks of a single failed disk.

22. An apparatus as defined in claim 20, further including a plurality of buffers connected between said controller and disks for buffering and caching data from said disks, thereby reducing the number of times at which said controller accesses said disks for revising data contents.

23. In an external storage subsystem, which comprises a disk array defined as a matrix or (N−1)*N consisting of N disks each logically divided into N−1 data blocks where N is a prime number, the data blocks of each row being defined as a horizontal parity group, the data blocks existing in a rightwardly and upwardly continuous diagonal line being defined as a diagonal parity group, the data blocks existing in the diagonal line leftwardly and downwardly from the first data block of the (N−1) disk to the last data block of the first disk being defined as the horizontal parity blocks, the data blocks existing in the (N−1) row of said matrix being defined as diagonal parity blocks, where the contents of each of said horizontal and diagonal parity groups are XOR'ed by a controller to produce the parity value stored into the parity block of the corresponding horizontal or diagonal parity group, a method for rebuilding the data contents of two failed disks i and j where $0 \leq i < j \leq N-1$, comprising the steps of:

(a) obtaining the difference k between the sequential numbers i and j of said two failed disks and initializing the parameter m to repeat the operation of rebuilding the data contents of said two failed disks to 0;

(b) obtaining the value $a_{(n,j)}$ of the "n"th block of the disk j having an error in the corresponding diagonal parity group by employing the following:

$$a_{(n,j)} = \bigoplus_{l=0}^{N-2} a_{(N-2-l, i+1-m*k+l \bmod N)}$$

where n=N−1−k−m*k mod N and i+1−m*k+1 mod N j;

(c) obtaining the value $a_{(n,i)}$ of the "n"th block of the disk i having an error in the corresponding horizontal parity group by employing the following:

$$a_{(n,i)} = \bigoplus_{l=0}^{N-1} a_{(n,l)}$$

Where 1 j; and (d) repeating steps (b) and (c) while increasing the parameter to N−2.

24. In an external storage subsystem, which comprises a disk array defined as a matrix of (N−1)*(N+1) consisting of N+1 disks each logically divided into N−1 data blocks where N is a prime number, the data blocks of each row being defined as a horizontal parity group, the data blocks except the data blocks of the last (N+1) disk existing in a rightwardly and upwardly continuous diagonal line being defined as a diagonal parity group, the data blocks of the last disk being defined as horizontal parity blocks, the data blocks existing in the (N−1) row of said matrix being defined as the diagonal parity blocks, where the contents of each of said horizontal and diagonal parity groups are XOR'ed by a controller to produce the parity value stored into the parity block of the corresponding horizontal or diagonal parity group, a method for rebuilding the data contents of two failed disks i and j where $0 \leq i < j \leq N-1$, comprising the steps of:

(a) obtaining the difference k between the sequential numbers i and j of said two failed disks and initializing the parameter m to repeat the operation of rebuilding the data contents of said two failed disks to 0;

(b) obtaining the value $a_{(n,j)}$ of the "n"th block of the disk j having an error in the corresponding diagonal parity group by employing the following:

$$a_{(n,j)} = \bigoplus_{l=0}^{N-2} a_{(N-2-l, i+1-m*k+l \bmod N)}$$

where n=N−1−k−m*k mod N and $$i+1-m*k+l \bmod N j$$

(c) obtaining the value $a_{(n,i)}$ of the "n"th block of the disk i having an error in the corresponding horizontal parity group by employing the following:

$$a_{(n,i)} = \bigoplus_{l=0}^{N-1} a_{(n,l)}$$

in case of n N−2 and i 1 and $$a(n, i) = \left( \bigoplus_{l=0}^{N} a(n, l) \right) \oplus \left( \bigoplus_{h=0}^{N-3} a(n, N) \right)$$

in case of n=N−2 and 1 i; and (d) repeating steps (b) and (c) while increasing the parameter to N−2.

* * * * *